United States Patent
Kohyama et al.

(10) Patent No.: US 10,706,527 B2
(45) Date of Patent: Jul. 7, 2020

(54) CORRECTION METHOD, CORRECTION APPARATUS, AND INSPECTION APPARATUS

(71) Applicant: LASERTEC CORPORATION, Kanagawa (JP)

(72) Inventors: Tsunehito Kohyama, Kanagawa (JP); Haruhiko Kusunose, Kanagawa (JP); Kiwamu Takehisa, Kanagawa (JP); Hiroki Miyai, Kanagawa (JP); Itaru Matsugu, Kanagawa (JP)

(73) Assignee: LASERTEC CORPORATION, Kanagawa (JP)

( * ) Notice: Subject to any disclaimer, the term of this patent is extended or adjusted under 35 U.S.C. 154(b) by 162 days.

(21) Appl. No.: 15/933,408

(22) Filed: Mar. 23, 2018

(65) Prior Publication Data
US 2018/0276812 A1    Sep. 27, 2018

(30) Foreign Application Priority Data
Mar. 27, 2017    (JP) .................... 2017-060994

(51) Int. Cl.
*G06K 9/00*    (2006.01)
*G06K 9/40*    (2006.01)
(Continued)

(52) U.S. Cl.
CPC ......... *G06T 7/0008* (2013.01); *G01N 21/956* (2013.01); *G03F 1/84* (2013.01);
(Continued)

(58) Field of Classification Search
USPC ............ 382/274, 144, 168, 312; 250/370.08
See application file for complete search history.

(56) References Cited

U.S. PATENT DOCUMENTS 5,029,221 A * 7/1991 Takiguchi ............. A61B 6/025
                                                250/370.08
7,421,120 B2 * 9/2008 Kang ...................... G06T 5/40
                                                358/1.9
(Continued)

FOREIGN PATENT DOCUMENTS

| CN | 104570616 | 4/2015 |
| JP | 2005241290 | 9/2005 |

(Continued)

OTHER PUBLICATIONS

Office Action dated Jul. 4, 2017 for corresponding JP Patent Application No. 2017-060994, and machine translation obtained from Japan Patent Office.

*Primary Examiner* — Kathleen Y Dulaney
(74) *Attorney, Agent, or Firm* — Renner, Otto, Boisselle & Sklar, LLP

(57) ABSTRACT

A correction method according to an embodiment includes illuminating an object to be inspected by using critical illumination by illumination light L11 generated by a light source 11, concentrating light from the object to be inspected illuminated by the illumination light L11 and acquiring image data of the object to be inspected by detecting the concentrated light by a first detector 23, concentrating part of the illumination light L11, and acquiring image data of a brightness distribution of the illumination light L11 by detecting the concentrated illumination light L11 by a second detector 33, and correcting the image data of the object to be inspected based on the image data of the brightness distribution.

5 Claims, 16 Drawing Sheets

(51) Int. Cl.
  *G06K 7/00*     (2006.01)
  *G01T 1/24*     (2006.01)
  *G06T 7/00*     (2017.01)
  *G06T 5/00*     (2006.01)
  *G01N 21/956*   (2006.01)
  *H04N 5/225*    (2006.01)
  *H04N 5/372*    (2011.01)
  *G03F 1/84*     (2012.01)

(52) U.S. Cl.
  CPC ........... *G06T 5/001* (2013.01); *H04N 5/2256* (2013.01); *H04N 5/372* (2013.01); *G01N 2021/95676* (2013.01); *G01N 2201/061* (2013.01); *G01N 2201/12* (2013.01); *G06T 2207/10152* (2013.01)

(56) References Cited

U.S. PATENT DOCUMENTS

| | | | | |
|---|---|---|---|---|
| 2002/0001405 | A1* | 1/2002 | Yonezawa | G01N 21/95607 382/149 |
| 2003/0179929 | A1* | 9/2003 | Zhang | A61B 5/0059 382/181 |
| 2004/0234114 | A1* | 11/2004 | Amakawa | G01N 21/6456 382/128 |
| 2005/0196059 | A1* | 9/2005 | Inoue | G03F 7/70616 382/240 |
| 2010/0060890 | A1 | 3/2010 | Tsuchiya et al. | |
| 2010/0310264 | A1* | 12/2010 | Ishida | G03G 15/5029 399/45 |
| 2011/0142365 | A1* | 6/2011 | Sakagami | H04N 5/2351 382/274 |
| 2015/0146053 | A1* | 5/2015 | Satoh | H04N 5/2354 348/279 |
| 2015/0221075 | A1 | 8/2015 | Watanabe | |
| 2016/0267648 | A1* | 9/2016 | Yamashita | G01N 21/95607 |
| 2017/0132772 | A1* | 5/2017 | Ogawa | G02B 27/283 |

FOREIGN PATENT DOCUMENTS

| | | |
|---|---|---|
| JP | 2006177737 | 7/2006 |
| JP | 2007093317 | 4/2007 |
| JP | 2010091552 | 4/2010 |
| JP | 2010272553 | 12/2010 |
| JP | 2011108711 | 6/2011 |
| JP | 2012002680 | 1/2012 |
| JP | 2012112729 | 6/2012 |
| JP | 2015145922 | 3/2015 |
| JP | 2016166789 | 9/2016 |

* cited by examiner

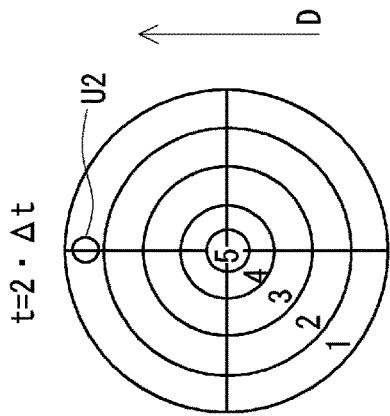
Fig. 16A
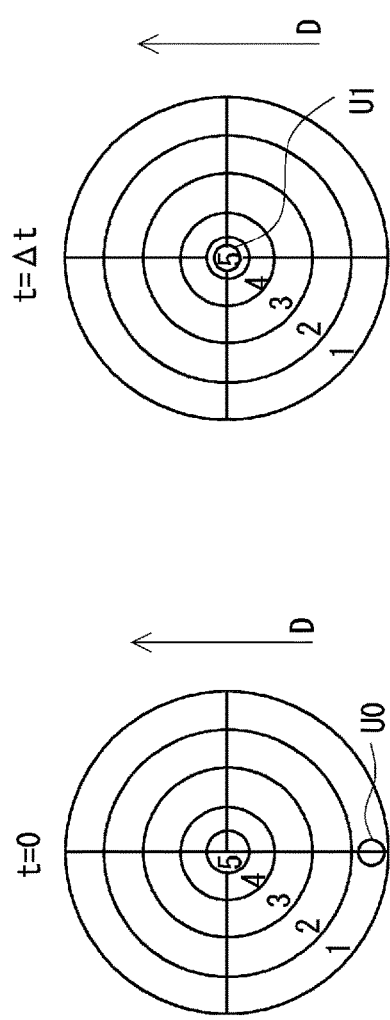
Fig. 16B
Fig. 16C
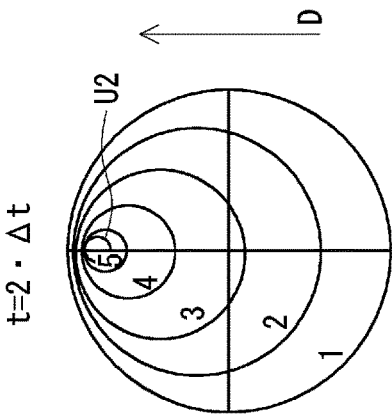
Fig. 16D
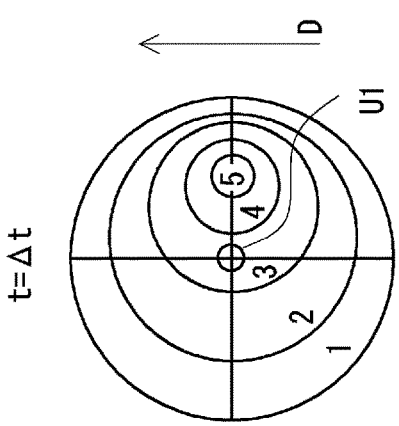
Fig. 16E
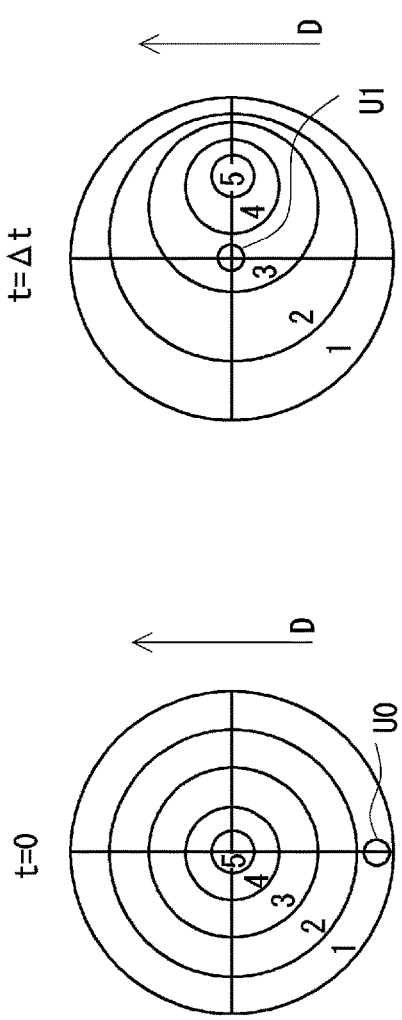
Fig. 16F

CORRECTION METHOD, CORRECTION APPARATUS, AND INSPECTION APPARATUS

INCORPORATION BY REFERENCE

This application is based upon and claims the benefit of priority from Japanese patent application No. 2017-060994, filed on Mar. 27, 2017, the disclosure of which is incorporated herein in its entirety by reference.

BACKGROUND

The present disclosure relates to a correction method, a correction apparatus, and an inspection apparatus. For example, the present disclosure relates to a correction method, a correction apparatus, and an inspection apparatus for correcting unevenness of brightness of a light source in image data used for an inspection of an EUV mask.

For example, in an inspection of a mask for EUV (Extra Ultra Violet) lithography (hereinafter, referred to as an EUV mask) critical illumination is used to ensure brightness of illumination light. The critical illumination is a method for illuminating an EUV mask in such a manner that an image of a light source is formed on an upper surface of the EUV mask, and uses an optical system that can illuminate the EUV mask with high brightness.

In an inspection using critical illumination, a shading correction for correcting a brightness distribution of illumination light in which unevenness of brightness (hereinafter referred to as "brightness unevenness") (i.e., shading) of a light source is taken into account is performed. For example, when a TDI (Time Delay Integration) detector is used as a detector for an inspection, a shading correction amount is determined based on a brightness distribution of illumination light that is acquired before starting the inspection. Then, a shading correction is performed for each output of the detector.

However, the present inventors have found the following problem. The brightness unevenness of the light source changes with the lapse of time and as a result of this change, the brightness distribution of the illumination light also changes with the lapse of time. If the brightness distribution of the illumination light changes with the lapse of time, a deviation from the shading correction amount acquired before the start of the inspection occurs and it eventually deteriorates the accuracy of the inspection. It is considered that there are two types of brightness unevenness, i.e., brightness unevenness caused by changes in the shape of the brightness distribution and brightness unevenness caused by changes in the position of the light source.

FIGS. 16A to 16C are diagrams showing examples of brightness distributions of illumination light, and show a case where the brightness distribution of the illumination light does not change with time. FIGS. 16D to 16F are diagrams showing examples of brightness distributions of illumination light, and show a case where the brightness distribution of the illumination light changes with time. FIGS. 16A, 16B and 16C show brightness distributions at detection times T0 (t=0), T1 (t=$\Delta$t) and T2 (t=2·$\Delta$t), respectively. Further, FIGS. 16D, 16E and 16F also show brightness distributions at detection times T0 (t=0), T1 (t=$\Delta$t) and T2 (t=2·$\Delta$t), respectively.

In each of FIGS. 16A to 16F, the brightness is divided into five levels 1 to 5. An area having a brightness level 5 is an area having the highest brightness. A scanning direction of a detector that detects the brightness distribution of the illumination light is one direction in each of FIGS. 16A to 16F. For example, the scanning direction is a direction D from the bottom of the figure toward the top there of. For example, when the detection times T0 (t=0), T1 (t=$\Delta$t) and T2 (t=2·$\Delta$t) have elapsed, a detection position U at which the detector performs detection moves along the direction D. For example, as the detection time T elapses, the detection position U changes to positions U0, U1 and U2 on a straight line that extends in the direction D and passes through the center of the brightness distribution.

As shown in FIGS. 16A to 16C, when the brightness distribution of the illumination light does not change over the time T0 (t=0) to T2 (t=2·$\Delta$t), no deviation occurs between the shading correction amount acquired before the start of the inspection and the brightness distribution detected at the direction time T. The brightness detected by the detector at the detection positions U0, U1 and U2 are 1, 5 and 1, respectively.

In contrast, as shown in shown in FIGS. 16D to 16F, when the brightness distribution of the illumination light changes over the time T0 (t=0) to T2 (t=2·$\Delta$t), a deviation occurs between the shading correction amount acquired before the start of the inspection and the brightness distribution detected at the direction time T. The brightness detected by the detector at the detection positions U0, U1 and U2 are 1, 3 and 5, respectively. Therefore, if the shading correction amount is determined based on the brightness distribution of the illumination light that is acquired before the start of the inspection, the accuracy of the inspection is deteriorated because the brightness acquired before the start of the inspection differs from the actual brightness during the inspection.

As described above, the brightness unevenness of the light source changes with time. Therefore, in the case where the brightness distribution of the illumination light changes with time, it is necessary to determine the shading correction amount for each output of the detector and perform a correction using the determined shading correction amount for each output of the detector. Further, in the case where the power of the light source changes with time, it is also necessary to perform a correction for each output of the detector.

The present disclosure has been made to solve the above-described problem and an object thereof is to provide a correction method, a correction apparatus, and an inspection apparatus capable of accurately correcting temporal variations in a brightness distribution of illumination light and thereby improving accuracy of an inspection.

SUMMARY

A first exemplary aspect is a correction method including: illuminating an object to be inspected by using critical illumination by illumination light generated by a light source; concentrating light from the object to be inspected illuminated by the illumination light and acquiring image data of the object to be inspected by detecting the concentrated light by a first detector; concentrating part of the illumination light, and acquiring image data of a brightness distribution of the illumination light by detecting the concentrated illumination light by a second detector; and correcting the image data of the object to be inspected based on the image data of the brightness distribution. By the above-described configuration, it is possible to accurately correct the brightness distribution of the illumination light.

Further, a detector including a TDI sensor is used for the first and second detectors. By using the detector including a TDI sensor as the second detector, it is possible to follow (i.e., keep track of) temporal variations in the brightness distribution of the illumination light and thereby accurately correct them.

Further, when the image data of the brightness distribution of the illumination light is acquired, part of the illumination light is taken out between a dropping mirror that makes the illumination light incident on the object to be inspected and a reflecting mirror that converges the illumination light and makes the converged light incident on the dropping mirror by using a cut mirror. By adopting the above-described configuration, it is possible to minimize the influence on the illumination light used for the inspection and thereby accurately inspect the object to be inspected.

In a cross-sectional area of a cross section of the illumination light perpendicular to an optical axis thereof at a place where the cut mirror is disposed, a cross-sectional area of the part of the illumination light is made smaller than that of the remaining part of the illumination light. By adopting the above-described configuration, it is possible to minimize the influence on the illumination light used for the inspection and thereby accurately inspect the object to be inspected.

Further, a magnification of the image data of the brightness distribution is made lower than that of the image data of the object to be inspected. By adopting the above-described configuration, it is possible to increase an amount of light for detecting the brightness distribution and thereby accurately correct the brightness distribution of the illumination light.

Further, when the image data of the object to be inspected is corrected, data is interpolated between each pixel included in the image data of the brightness distribution and a resolution of the image data of the brightness distribution is conformed to that of the image data of the object to be inspected. By adopting the above-described configuration, it is possible to accurately correct the brightness distribution of the illumination light.

Another exemplary aspect is a correction apparatus including: an illumination optical system configured to illuminate an object to be inspected by using critical illumination by illumination light generated by a light source; a detection optical system configured to concentrate light from the object to be inspected illuminated by the illumination light and acquire image data of the object to be inspected by detecting the concentrated light by a first detector; a monitor unit configured to concentrate part of the illumination light and acquire image data of a brightness distribution of the illumination light by detecting the concentrated illumination light by a second detector; and a processing unit configured to correct the image data of the object to be inspected based on the image data of the brightness distribution. By adopting the above-described configuration, it is possible to accurately correct the brightness distribution of the illumination light and improve the accuracy of the inspection.

Further, each of the first and second detectors is a detector including a TDI sensor. By adopting the above-described configuration, it is possible to follow (i.e., keep track of) temporal variations of the brightness distribution of the light source and thereby accurately correct them.

Further, the illumination optical system includes a dropping mirror configured to make the illumination light incident on the object to be inspected and a reflecting mirror configured to converge the illumination light and make the converged light incident on the dropping mirror, and the monitor unit includes a cut mirror configured to take out part of the illumination light between the reflecting mirror and the dropping mirror. By adopting the above-described configuration, it is possible to minimize the influence on the illumination light used for the inspection and thereby accurately inspect the object to be inspected.

In a cross-sectional area of a cross section of the illumination light perpendicular to an optical axis thereof at a place where the cut mirror is disposed, a cross-sectional area of the part of the illumination light is smaller than that of the remaining part of the illumination light. By adopting the above-described configuration, it is possible to minimize the influence on the illumination light used for the inspection and thereby accurately inspect the object to be inspected.

Further, a magnification of the image data of the brightness distribution acquired by the monitor unit is lower than that of the image data of the object to be inspected acquired by the detection optical system. By adopting the above-described configuration, it is possible to increase an amount of light for detecting the brightness distribution and thereby accurately correct the brightness distribution of the illumination light.

Further, the processing unit interpolates data between each pixel included in the image data of the brightness distribution and thereby conforms a resolution of the image data of the brightness distribution to that of the image data of the object to be inspected. By adopting the above-described configuration, it is possible to accurately correct the brightness distribution of the illumination light.

Another exemplary aspect is an inspection apparatus including the above-described correction apparatus, in which the processing unit inspects the object to be inspected based on the corrected image data of the object to be inspected. By adopting the above-described configuration, it is possible to accurately correct the brightness distribution of the illumination light and improve the accuracy of the inspection.

According to the present disclosure, it is possible to provide a correction method, a correction apparatus, and an inspection apparatus capable of accurately correcting temporal variations in a brightness distribution of illumination light and thereby improving accuracy of an inspection.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 16A is a diagram showing an example of a brightness distribution of illumination light and shows a case where the brightness distribution of the illumination light does not change with time;

FIG. 16B is a diagram showing an example of a brightness distribution of illumination light and shows a case where the brightness distribution of the illumination light does not change with time;

FIG. 16C is a diagram showing an example of a brightness distribution of illumination light and shows a case where the brightness distribution of the illumination light does not change with time;

FIG. 16D is a diagram showing an example of a brightness distribution of illumination light and shows a case where the brightness distribution of the illumination light changes with time;

FIG. 16E is a diagram showing an example of a brightness distribution of illumination light and shows a case where the brightness distribution of the illumination light changes with time; and FIG. 16F is a diagram showing an example of a brightness distribution of illumination light and shows a case where the brightness distribution of the illumination light changes with time.

DESCRIPTION OF EMBODIMENTS

Best modes for carrying out the present disclosure are explained hereinafter with reference to the accompanying drawings. However, the present disclosure is not limited to the below-shown embodiments. Further, the following descriptions and the drawings are simplified as appropriate for clarifying the explanation.

First Embodiment

<Configuration of Inspection Apparatus>

Figure 1:
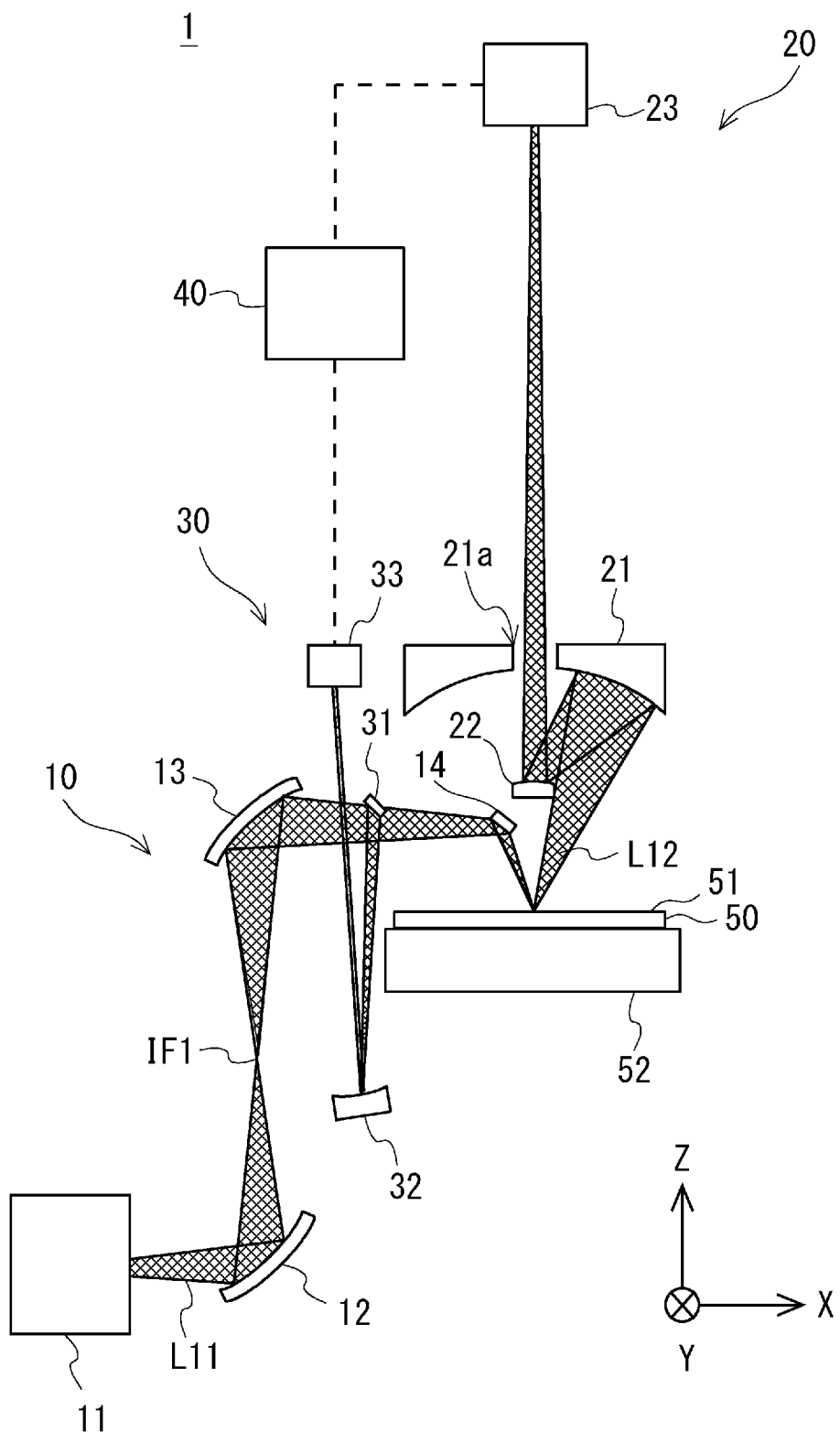
FIG. 1 is a block diagram showing an example of an inspection apparatus according to a first embodiment.

An inspection apparatus according to a first embodiment is explained. Firstly, a configuration of the inspection apparatus according to the first embodiment is explained. FIG. 1 is a configuration diagram showing an example of an inspection apparatus 1 according to the first embodiment. The inspection apparatus 1 includes an illumination optical system 10, a detection optical system 20, a monitor unit 30, and a processing unit 40. The illumination optical system 10 includes a light source 11, an ellipsoidal mirror 12, an ellipsoidal mirror 13, and a dropping mirror 14. The detection optical system 20 includes a concave mirror 21 with a hole formed therein (hereinafter referred to as a holed concave mirror 21), a convex mirror 22, and a first detector 23. The holed concave mirror 21 and the convex mirror 22 form a Schwarzschild magnification optical system. The monitor unit 30 includes a cut mirror 31, a concave mirror 32, and a second detector 33. The inspection apparatus 1 is an apparatus for inspecting an object to be inspected for a defect or the like. The object to be inspected is, for example, an EUV mask 50. Note that the object to be inspected is not limited to the EUV mask 50.

The light source 11 generates illumination light L11. The illumination light L11 contains, for example, EUV light having a wavelength of 13.5 nm, which is the same wavelength as an exposure wavelength for the EUV mask 50, i.e., for the object to be inspected. The illumination light L11 generated by the light source 11 is reflected on the ellipsoidal mirror 12. The illumination light L11 reflected on the ellipsoidal mirror 12 travels while becoming narrower (i.e., while its cross section is becoming smaller) and is concentrated at a focal point IF1. The focal point IF1 is positioned in a place conjugate with an upper surface 51 of the EUV mask 50.

After passing through the focal point IF1, the illumination light L11 travels while spreading (i.e., while its cross section is becoming larger) and is incident on a reflecting mirror such as the ellipsoidal mirror 13. The illumination light L11 incident on the ellipsoidal mirror 13 is reflected thereon and travels while becoming narrower. Then, the narrowed illumination light L11 is incident on the dropping mirror 14. That is, the ellipsoidal mirror 13 converges the illumination light L11 and makes the converged light incident on the dropping mirror 14. The dropping mirror 14 is disposed right above the EUV mask 50. The illumination light L11, which has been incident on the dropping mirror 14 and reflected thereon, is incident on the EUV mask 50. That is, the dropping mirror 14 makes the illumination light L11 incident on the EUV mask 50.

The ellipsoidal mirror 13 concentrates the illumination light L11 onto the EUV mask 50. The illumination optical system 10 is configured so that when the illumination light L11 illuminates the EUV mask 50, an image of the light source 11 is formed on the upper surface 51 of the EUV mask 50. Therefore, the illumination optical system 10 provides critical illumination. In this way, the illumination optical system 10 illuminates the object to be inspected by using the critical illumination provided by the illumination light L11 generated by the light source 11.

The EUV mask 50 is disposed on a stage 52. Note that a plane parallel to the upper surface 51 of the EUV mask 50 is defined as an XY-plane and a direction perpendicular to the XY plane is defined as a Z-direction. The illumination light L11 enters (i.e., incident on) the EUV mask 50 in a direction inclined from the Z-direction. That is, the illumination light L11 obliquely enters (i.e., is obliquely incident on) the EUV mask 50 and illuminates the EUV mask 50.

The stage 52 is an XYZ-drive stage. By moving the stage 52 in XY-directions, a desired area on the EUV mask 50 is illuminated. Further, a focus can be adjusted by moving the stage 52 in the Z-direction.

The illumination light L11 emitted from the light source 11 illuminates an inspection area on the EUV mask 50. The inspection area illuminated by the illumination light L11 is, for example, an area of 0.5 mm square. Reflected light L12, i.e., the light that has been incident on the EUV mask 50 in the direction inclined from the Z-direction and reflected thereon, is incident on the holed concave mirror 21. A hole 21a is formed at the center of the holed concave mirror 21.

The reflected light L12 reflected on the holed concave mirror 21 is incident on the convex mirror 22. The convex mirror 22 reflects the reflected light L12 coming from the holed concave mirror 21 toward the hole 21a of the holed concave mirror 21. The reflected light L12, which has passed through the hole 21a, is detected by the first detector 23. The first detector 23 is a detector including a TDI (Time Delay Integration) sensor and acquires image data of the object to be inspected, i.e., the EUV mask 50. The first detector 23 includes a plurality of image pickup elements arranged in a line in one direction. Image data taken by the plurality of image pickup elements arranged in a line is referred to as one-dimensional image data or one frame. The first detector 23 acquires a plurality of one-dimensional image data by performing scanning in a direction perpendicular to the one direction. The image pickup element is, for example, a CCD (Charge Coupled Device). Note that the image pickup element is not limited to the CCD.

As described above, the detection optical system 20 concentrates the reflected light L12 from the object to be inspected illuminated by the illumination light L11 and acquires image data of the EUV mask 50 by detecting the concentrated reflected light L12 by the first detector 23. The image data is, for example, one-dimensional image data.

The reflected light L12 contains information on a defect on the EUV mask 50 and the like. Specular reflection light of the illumination light L11, which has been incident on the EUV mask 50 in the direction inclined from the Z-direction, is detected by the detection optical system 20. When there is a defect on the EUV mask 50, the defect is observed as a dark image. Such an observation method is called a bright-field observation. The plurality of one-dimensional image data of the EUV mask 50 acquired by the first detector 23 are output to the processing unit 40 and processed into two-dimensional image data there.

Figure 2:
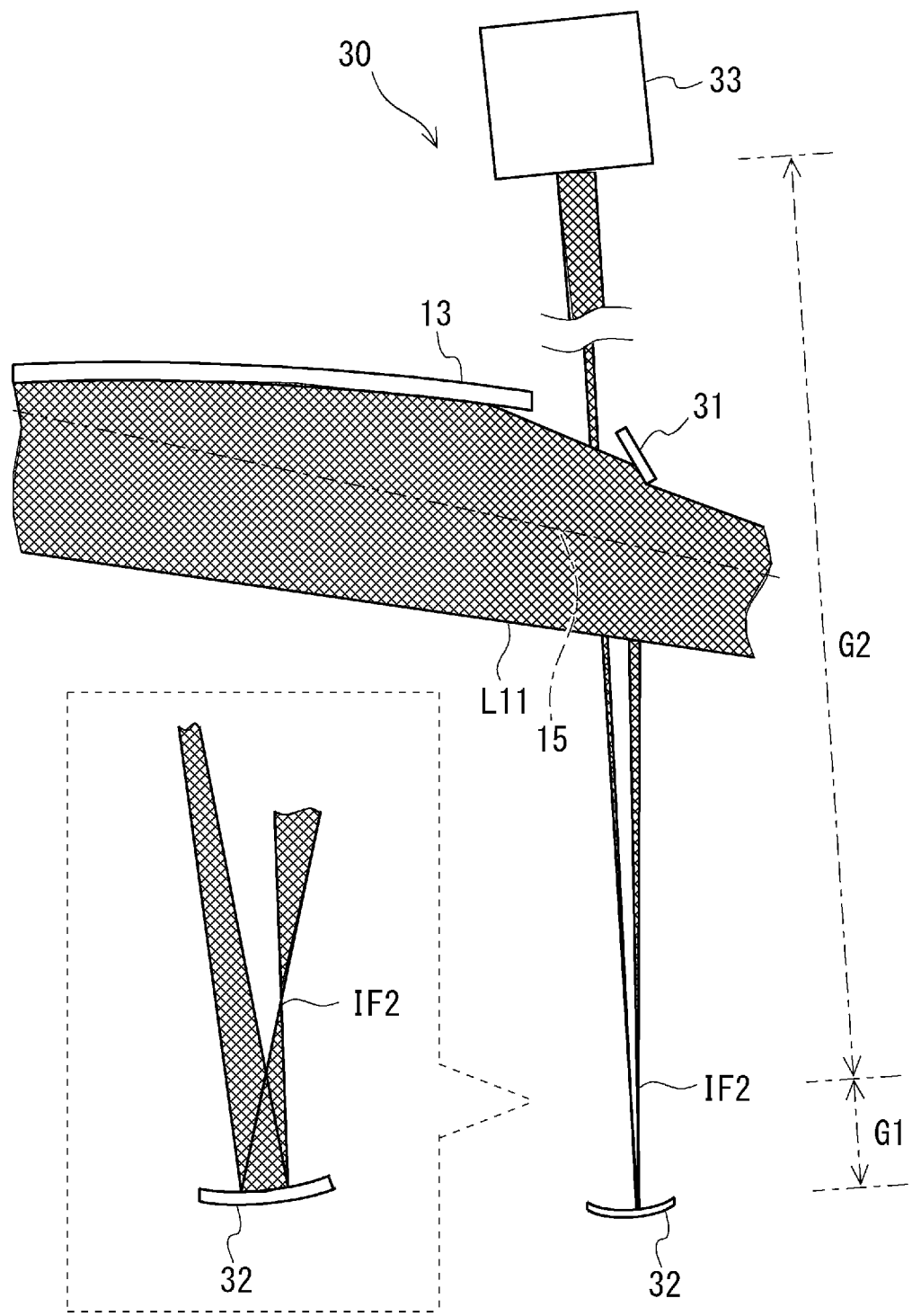
FIG. 2 is a configuration diagram showing an example of a monitor unit in the inspection apparatus according to the first embodiment.

FIG. 2 is a configuration diagram showing an example of the monitor unit 30 in the inspection apparatus 1 according to the first embodiment. FIG. 2 also shows an enlarged view of the concave mirror 32 and the periphery thereof. As shown in FIGS. 1 and 2, the cut mirror 31 of the monitor unit 30 is disposed between the ellipsoidal mirror 13 and the dropping mirror 14, and takes out part of the illumination light L11 between the ellipsoidal mirror 13 and the dropping mirror 14. The cut mirror 31 reflects a small part of the beam of the illumination light L11 so that the small part is cut out from the illumination light L11. The part of the beam is, for example, an upper part of the beam.

In a cross-sectional area of a cross section of the illumination light L11 perpendicular to an optical axis 15 thereof at a place where the cut mirror 31 is disposed, a cross-sectional area of the part of the illumination light L11 reflected by the cut mirror 31 is smaller than that of the remaining part of the illumination light L11.

For example, when the cross-sectional area of the cross section perpendicular to the optical axis 15 of the illumination light L11 at the place where the cut mirror 31 is disposed is 100, the cross-sectional area of the taken-out part is about 1. The angle for taking out the part of the illumination light L11 which is taken out from the light source 11 in the direction perpendicular to the optical axis 15 is, for example, +70. The angle of the illumination light L11 used for the EUV mask 50 is, for example, in the range of +6°. Only the upper part of the beam of the illumination light L11 in the range of, for example, 1° is taken out by the cut mirror 31 in order to use it in the monitor unit 30. Even when the upper part of the beam is slightly taken out as described above, the amount of the illumination light L11 incident on the EUV mask 50 barely decreases. Therefore, it is possible to minimize the deterioration of the accuracy of the inspection.

The cut mirror 31 is disposed in, for example, a place close to a pupil in the illumination optical system 10. By taking out the part of the illumination light L11 by the cut mirror 31 in the place close to the pupil in the illumination optical system 10, it is possible to obtain an excellent correlation between image data acquired by the first detector 23 and image data acquired by the second detector 33. Even when an NA (Numerical Aperture) for the first detector 23 differs from an NA for the second detector 33 and hence their PSFs (Point Spread Functions) differ from each other, the difference between the NAs has no adverse effect in this embodiment because the plasma size is sufficiently larger than the PSF size.

The illumination light L11, which has been reflected on the cut mirror 31, travels while becoming narrower and is concentrated at a focal point IF2. After that, the illumination light L11 travels while spreading and is incident on the concave mirror 32.

The concave mirror 32 and a plurality of mirrors (not shown) enlarge the part of the illumination light L11 taken out by the cut mirror 31. Here, a distance between the focal point IF2 and the concave mirror 32 is represented by a distance G1 and a distance between the focal point IF2 and the second detector 33 is represented by a distance G2. Image data acquired by the second detector 33 can be magnified. However, in order to obtain a high magnification (up to 500), the distance G2 is greatly increased. For example, when the distance G1 is set to 5 mm or shorter, the distance G2 is set to 2,500 mm or shorter. In this way, a magnification of 500 times is obtained. For example, a magnification of 500 times can be obtained by using a plurality of mirrors.

In this embodiment, a magnification of image data of a brightness distribution acquired by the monitor unit 30 is equal to that of image data of an object to be inspected acquired by the detection optical system 20. Note that as explained later in a second embodiment, the magnification of the image data of the brightness distribution acquired by the monitor unit 30 may be lower than that of the image data of the object to be inspected acquired by the detection optical system 20. A solid angle necessary for taking out part of the light is equivalent to the square of the magnifications ratio. For example, when the magnification of the first detector 23 is 20 times and the magnification of the second detector 33 is 2 times, the solid angle necessary for taking out the part of the light by using the cut mirror 31 is one hundredth ($1/100$) of the solid angle for taking out the light from the light source 11. When expressed by the NA, it is one tenth ($1/10$).

The illumination light L11, which has been incident on the concave mirror 32 and reflected thereon, is detected by the second detector 33. The second detector 33 is a detector including a TDI (Time Delay Integration) sensor and acquires image data of a brightness distribution of the illumination light L11. The second detector 33 includes a plurality of image pickup elements arranged in a line in one direction. Similarly to the first detector 23, image data taken by the plurality of image pickup elements arranged in a line is referred to as one-dimensional image data or one frame. The second detector 33 acquires a plurality of one-dimensional image data by performing scanning in a direction perpendicular to the one direction. The one-dimensional image data acquired by the second detector 33 indicates variations in the power (hereinafter referred to as power variations) of the illumination light L11 and a brightness distribution thereof. The image pickup element is, for example, a CCD (Charge Coupled Device). Note that the image pickup element is not limited to the CCD.

For example, the optical system is configured so that an image of the light source 11 for the illumination light L11 is formed on the second detector 33. In this way, the monitor unit 30 acquires image data of a brightness distribution of the illumination light L11 that is detected by irradiating the second detector 33 with critical illumination by using the part of the illumination light L11. Therefore, it is possible to accurately correct the brightness distribution and the power variations. As described above, the monitor unit 30 concentrates the part of the illumination light L11 and acquires image data of the power variations and the brightness distribution of the illumination light L11 by detecting the concentrated illumination light L11 by the second detector 33. The image data of the power variations and the brightness distribution of the illumination light L11 acquired by the second detector 33 is output to the processing unit 40.

The processor 40 is connected to the detection optical system 20 and the monitoring unit 30 through signal lines or wirelessly. The processing unit 40 receives image data of the object to be inspected from the first detector 23 of the detection optical system 20. Further, the processing unit 40 receives image data of the power variations and the brightness distribution of the illumination light L11 from the second detector 33 of the monitor unit 30.

The processing unit 40 corrects the image data of the EUV mask 50 acquired by the detection optical system 20 based on the image data of the power variations and the brightness distribution acquired by the monitoring unit 30. In addition, the processor 40 inspects the EUV mask 50 based on the corrected image data of the EUV mask 50. Because of the fact that the inspection apparatus 1 inspects an object to be inspected based on corrected image data of the object to be inspected, the inspection apparatus 1 can be considered to be equipped with a correction apparatus.

Figure 3:
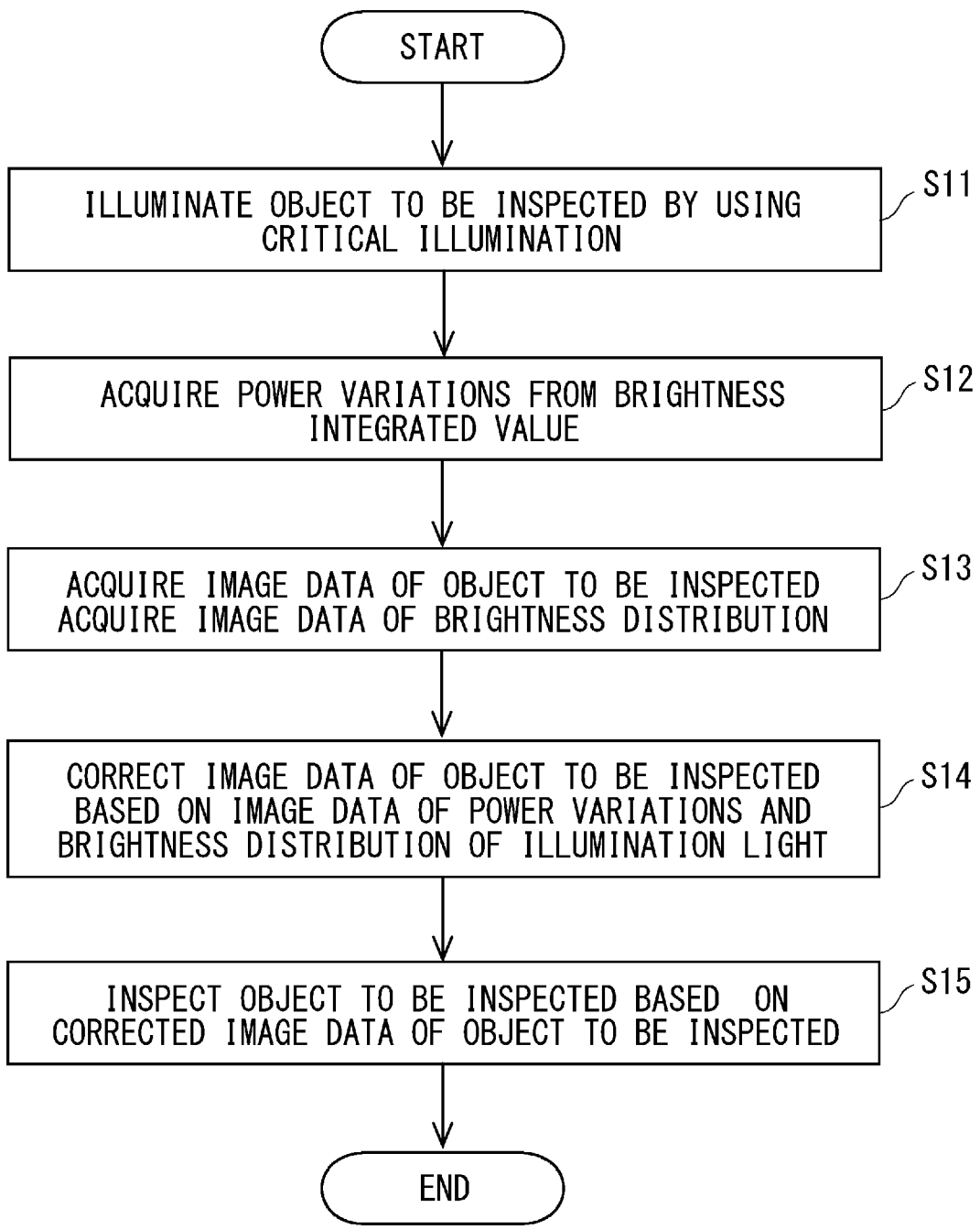
FIG. 3 is a flowchart showing an example of a correction method and an inspection method according to the first embodiment.

Next, as operations performed by the inspection apparatus 1 according to the first embodiment, a correction method and an inspection method are explained. The inspection apparatus 1 corrects image data of an object to be inspected and inspects the object to be inspected. FIG. 3 is a flowchart showing an example of a correction method and an inspection method according to the first embodiment. As shown in a step S11 in FIG. 3, firstly, an object to be inspected is illuminated by using critical illumination. Specifically, in the case of illuminating an EUV mask 50 by illumination light L11 generated by the light source 11, the illumination optical system 10 is configured so that the EUV mask 50 is illuminated by critical illumination. Then, the EUV mask 50 is illuminated by the illumination light L1.

Next, as shown in a step S12 in FIG. 3, power variations are acquired from a brightness integrated value. Specifically, the processing unit 40 integrates (i.e., adds up) brightness of the illumination light L11 in one frame acquired by the second detector 33 and acquires power variations in the illumination light L11 based on the integrated value of the brightness.

Each of FIGS. 4A, 5A, 6A and 7A shows an example of image data of a brightness distribution on the object to be inspected acquired by the first detector 23 in the inspection apparatus 1 according to the first embodiment. Further, each of FIGS. 4B, 5B, 6B and 7B shows an example of image data of a brightness distribution of the illumination light L11 acquired by the second detector 33.

FIGS. 4A and 4B, FIGS. 5A and 5B, FIGS. 6A and 6B, and FIGS. 7A and 7B show images of brightness distributions at detection times T0 (t=0), T1 (t=Δt), T2 (t=2Δt), and T3 (t=3Δt), respectively. In each of FIGS. 4A to 7B, the brightness is divided into five levels 1 to 5. A part having a brightness level 5 indicates a part having the highest brightness. The scanning direction of the first and second detectors 23 and 33 is a direction D from the bottom toward the top.

Figure 4B:
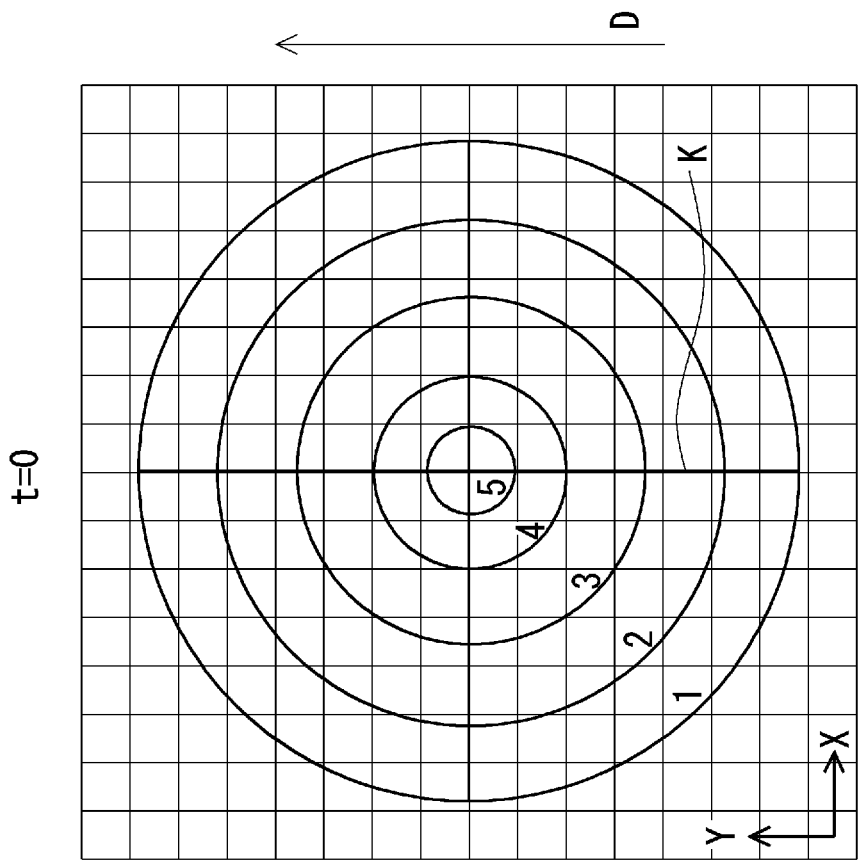
FIG. 4B is a diagram showing an example of image data of a brightness distribution of illumination light acquired by a second detector in the inspection apparatus according to the first embodiment.
Figure 4A:
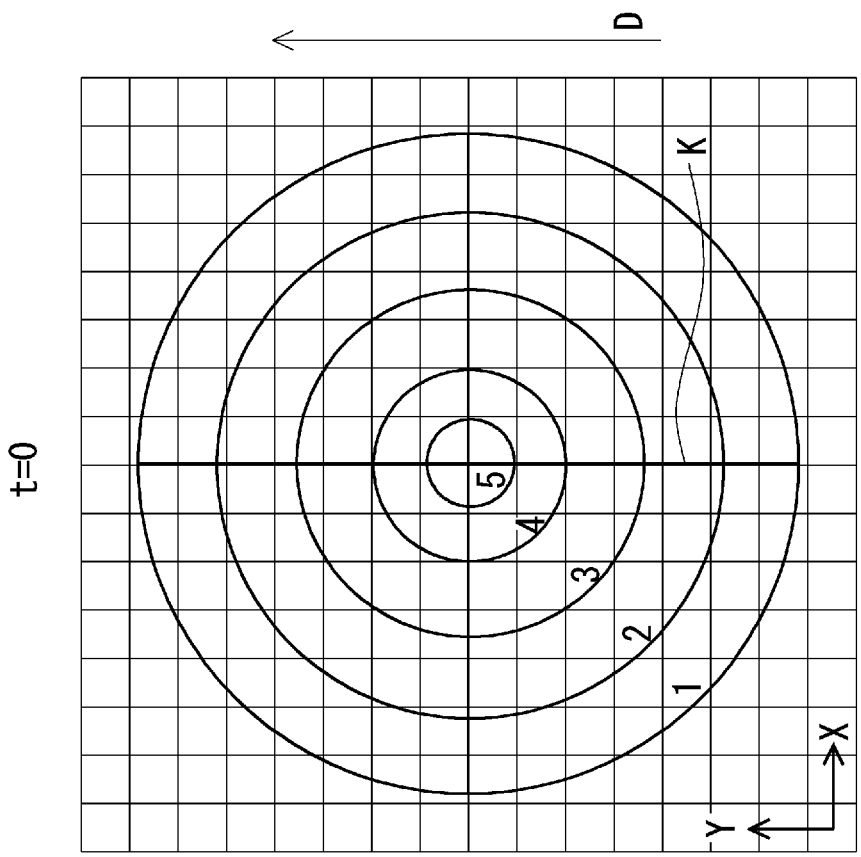
FIG. 4A is a diagram showing an example of image data of a brightness distribution on an object to be inspected acquired by a first detector in the inspection apparatus according to the first embodiment.

As shown in FIGS. 4A and 4B, at the detection time T0 (t=0), the image data of the brightness distribution on the object to be inspected is, for example, a concentric-circle image in which the closer the place is to the center the stronger its intensity becomes. As shown in FIG. 4B, the processing unit 40 calculates an integrated value P2 (t=0) of the brightness of the illumination light L11 based on one frame of image data of the brightness distribution acquired by the second detector 33. For example, the processing unit 40 calculates the integrated value P2 (t=0) by integrating brightness of one frame detected by the second detector 33 in a period in which the time t is expressed as "$-\Delta t_{exposure} \leq t \leq 0$", where $\Delta t_{exposure}$ is an integration time. The integrated value P2 (t=0) is expressed by the below-shown Expression (1).

$$P2(0)=P2(t=0) \quad (1)$$

The processing unit 40 calculates an integrated value P2 (t=ti) at a detection time T1 (t=ti) by integrating brightness of one frame detected by the second detector 33 in a period in which the time t is expressed as "ti$-\Delta t_{exposure} \leq t \leq$ti". The integrated value P2 (t=ti) is expressed by the below-shown Expression (2).

$$P2(ti)=P2(t=ti) \quad (2)$$

Variations in the integrated value P2 (ti) indicates power variations of the illumination light L11. In this way, the processing section 40 acquires the power variations of the illumination light L11. The acquired image data is output to the processing unit 40.

Next, as shown in a step S13 in FIG. 3, image data of the object to be inspected and image data of a brightness distribution of the illumination light L11 are acquired.

Figure 5B:
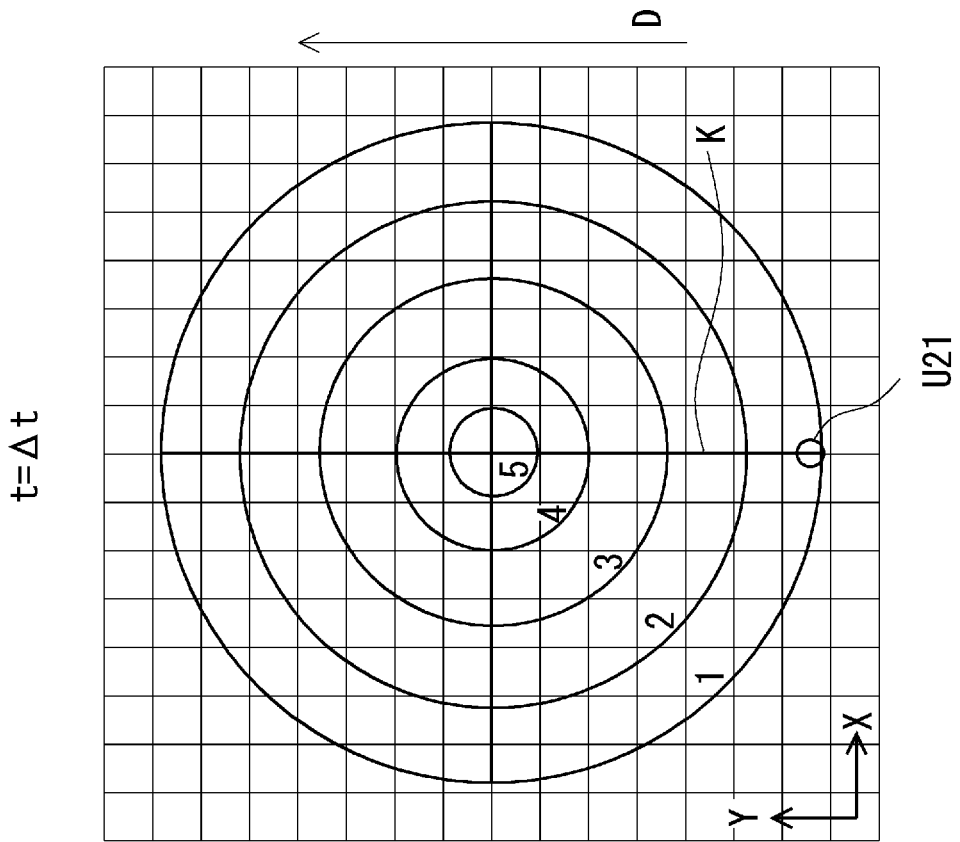
FIG. 5B is a diagram showing an example of image data of a brightness distribution of illumination light acquired by the second detector in the inspection apparatus according to the first embodiment.
Figure 5A:
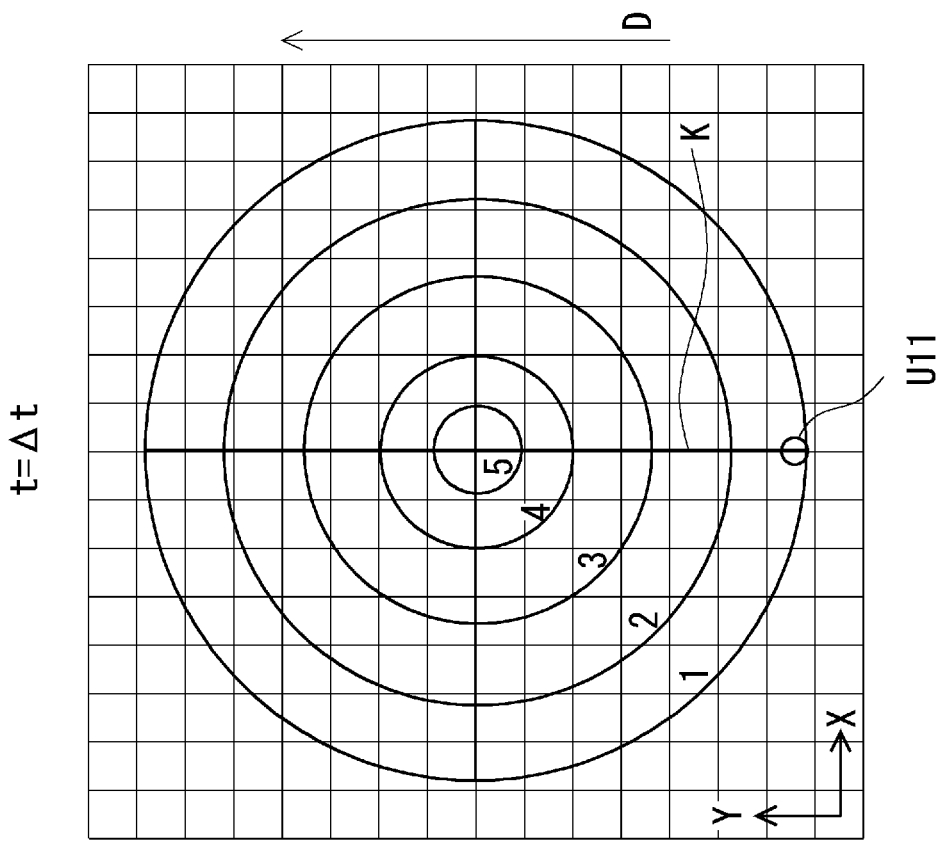
FIG. 5A is a diagram showing an example of image data of a brightness distribution on an object to be inspected acquired by the first detector in the inspection apparatus according to the first embodiment.

As shown in FIGS. 5A and 5B, at the detection time T1 (t=Δt), the brightness distribution of the illumination light L11 is, for example, a concentric-circle distribution as in the case of the distribution at the detection time T0. Each of detection positions U11 and U21 of the first and second detectors 23 and 33, respectively, is a predetermined position on the negative side in the Y-axis direction on a straight line K that extends in the Y-axis direction and passes through the center of concentric circles. The brightness values of both of the detection positions U11 and U21 are 1.

Figure 6A:
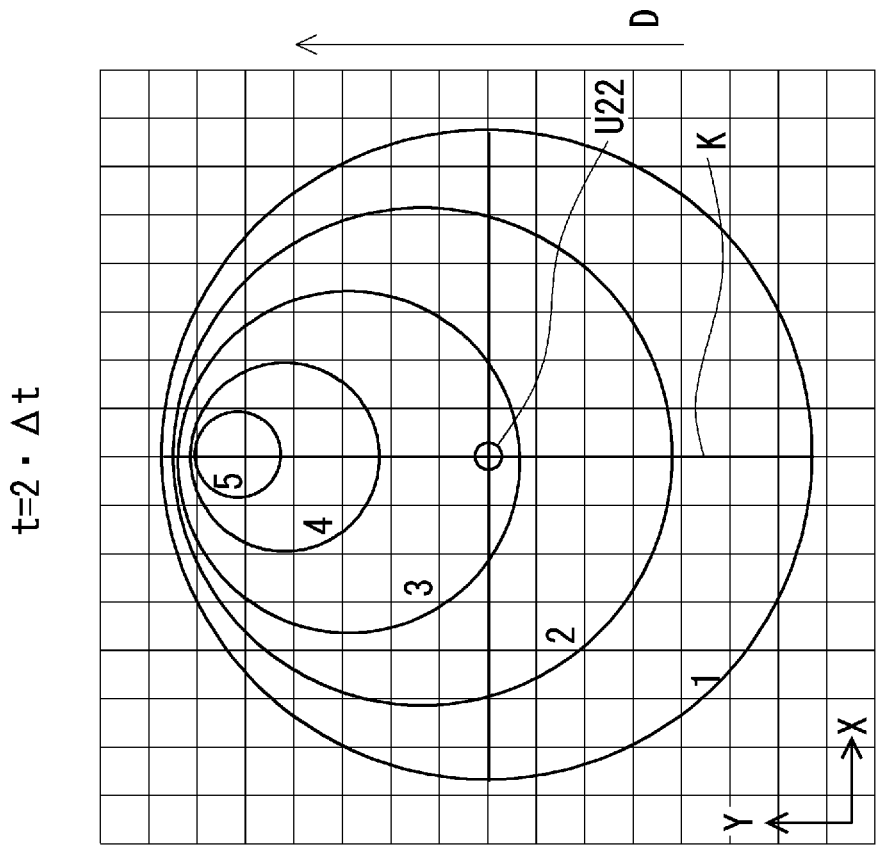
FIG. 6A is a diagram showing an example of image data of a brightness distribution on an object to be inspected acquired by the first detector in the inspection apparatus according to the first embodiment.
Figure 6B:
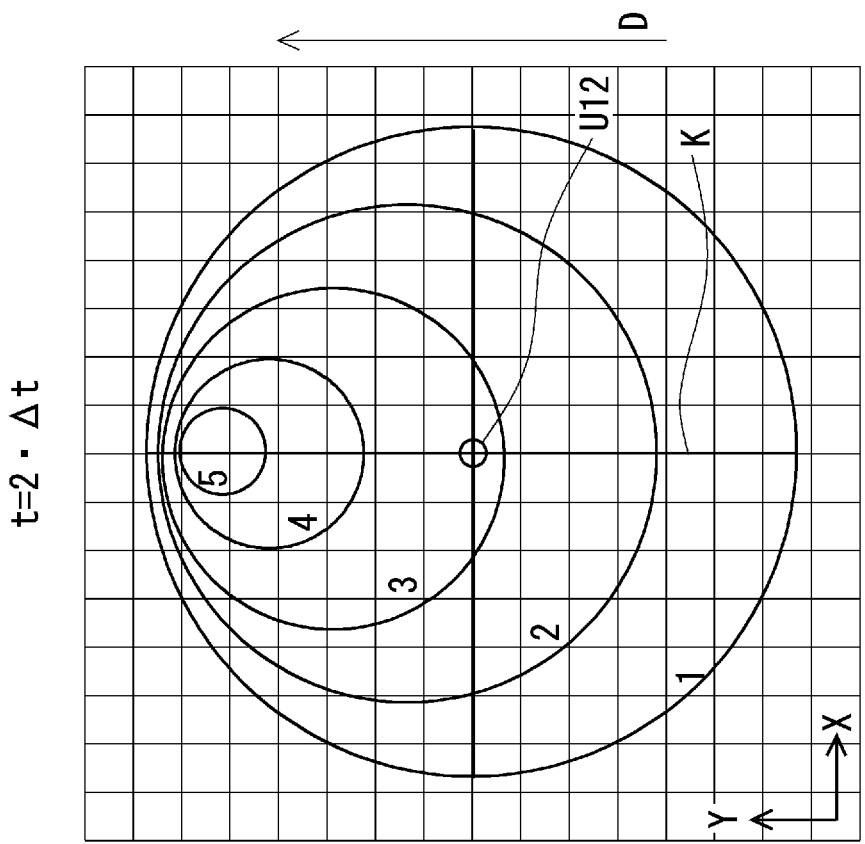
FIG. 6B is a diagram showing an example of image data of a brightness distribution of illumination light acquired by the second detector in the inspection apparatus according to the first embodiment.

As shown in FIGS. 6A and 6B, at the detection time T2 (t=2·Δt), the brightness distribution of the illumination light L11 is, for example, a distribution whose center is deviated to the positive side in the Y-axis direction. Detection positions U12 and U22 of the first and second detectors 23 and 33, respectively, have been moved to the vicinity of the center of the straight line K. The brightness values of both of the detection positions U12 and U22 are 3.

Figure 7B:
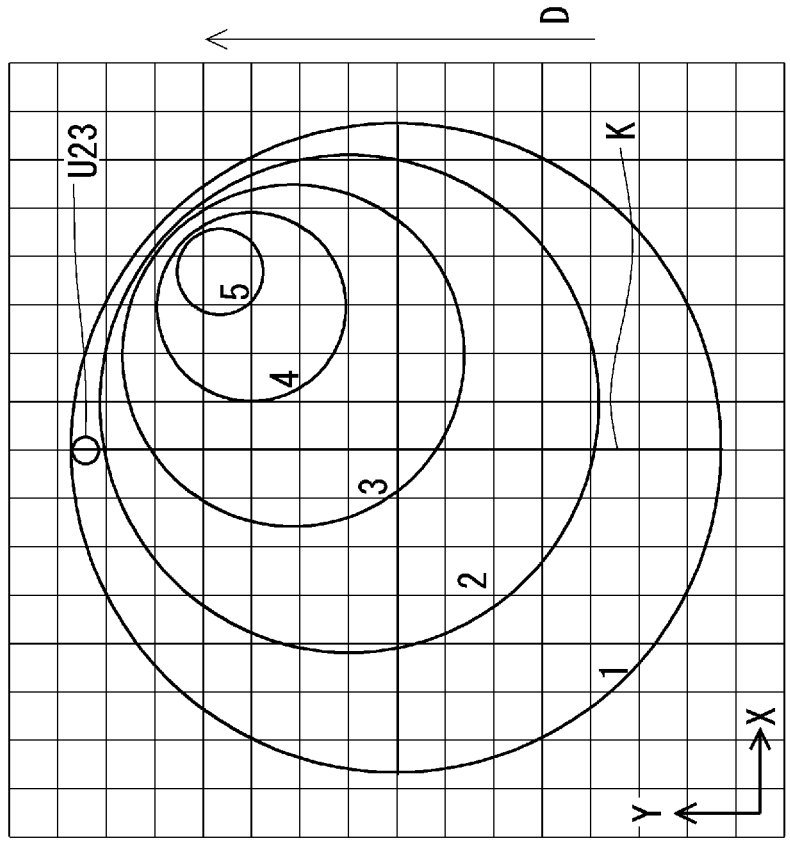
FIG. 7B is a diagram showing an example of image data of a brightness distribution of illumination light acquired by the second detector in the inspection apparatus according to the first embodiment.
Figure 7A:
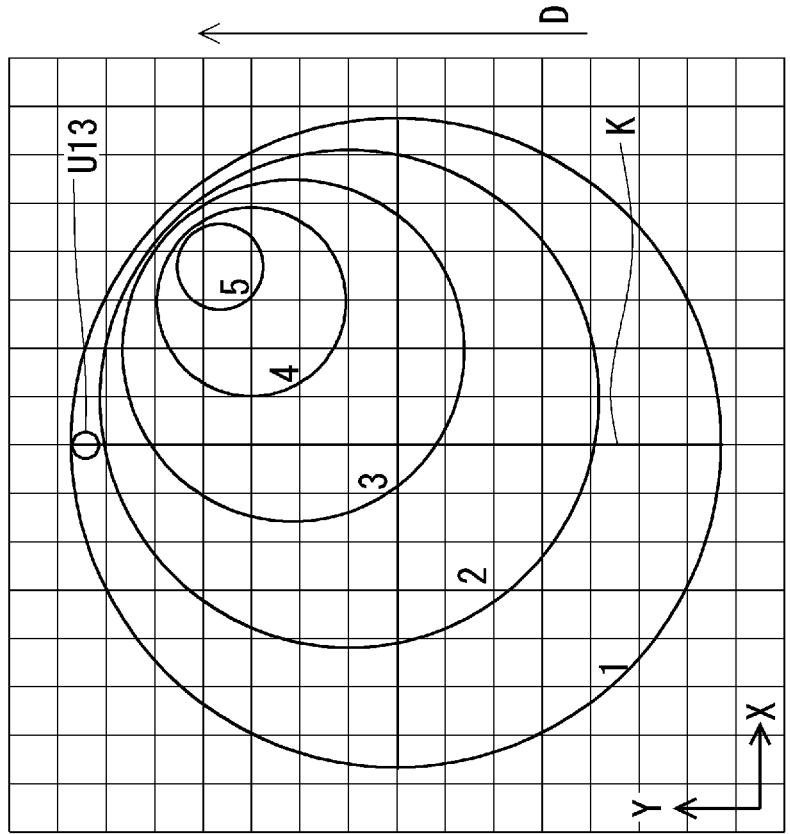
FIG. 7A is a diagram showing an example of image data of a brightness distribution on an object to be inspected acquired by the first detector in the inspection apparatus according to the first embodiment.

As shown in FIGS. 7A and 7B, at the detection time T3 (t=3·Δt), the brightness distribution of the illumination light L11 is, for example, a distribution whose center is deviated to the positive side in the X-axis direction and the positive side in the Y-axis direction. Detection positions U13 and U23 of the first and second detectors 23 and 33, respectively, have been moved in the Y-axis positive direction on the straight line K. The brightness values of both of the detection positions U13 and U23 are 1.

Next, as shown in a step S14 in FIG. 3, the image data of the object to be inspected is corrected based on the power variations and the brightness distribution of the illumination light L11. Specifically, the processing unit 40 performs a shading correction in which the power variations and the brightness distribution of the illumination light L11 are taken into account for each pixel of one-dimensional image data of the object to be inspected at each detection time acquired by the first detector 23. In the shading correction, brightness I1(xi, ti) of each pixel of the image data acquired by the first detector 23 is corrected by using the below-shown Expression (3).

$$I1'(xi,ti)=I1(xi,ti) \cdot \{P2(0)/P2(ti)\} \cdot \{I2ave(ti)/I2(xi,ti)\} \quad (3)$$

In the above-shown expression, I1'(xi, ti) indicates corrected brightness in the image data acquired by the first detector 23. I1(xi, ti) indicates brightness of a pixel at a position xi output at time ti. I2ave(t) indicates an average value of the brightness distribution at time ti acquired by the second detector 33. I2(xi, ti) indicates brightness of a pixel at a position xi output at time ti in the image data acquired by the second detector 33.

That is, the processing unit 40 continuously and separately monitors the first detector 23 for detecting a defect and the second detector 33 for a shading correction, and corrects one-dimensional image data of the object to be inspected for each output of the first and second detectors 23 and 33 based on the power variations and the brightness distribution of the illumination light L11. In this way, the processing unit 40 corrects the power variations and the brightness distribution at the same time.

As described above, each one-dimensional image data of the object to be inspected is corrected based on the power variations and the brightness distribution of the illumination light L11. When there are a plurality of frames, image data of the object to be inspected is corrected for every frame based on the power variations and the brightness distribution of the illumination light L11. Because of the fact that the inspection apparatus 1 according to this embodiment corrects image data of an object to be inspected, the inspection apparatus 1 can be considered to be equipped with a correction apparatus.

Next, as shown in a step S15 in FIG. 3, the object to be inspected is inspected based on the corrected image data of the object to be inspected. Specifically, the first detector 23 detects reflected light L12, i.e., the illumination light L11 that has been reflected on the EUV mask 50, i.e., the object to be inspected. Then, a shading correction is performed on one-dimensional image data acquired by the first detector 23 as described above. By combining a plurality of corrected one-dimensional image data, two-dimensional image data of the object to be inspected is obtained. The two-dimensional image data contains information on a defect on the object to be inspected and the like. For example, a defect or the like is detected as an image in a bright-field observation. In this way, it is possible to inspect the object to be inspected.

Next, advantageous effects of this embodiment are explained.

In the inspection apparatus 1 according to this embodiment, a brightness distribution of illumination light L11 is monitored and an image of an object to be inspected is corrected based on the monitored brightness distribution. Therefore, it is possible to accurately correct power variations and the brightness distribution of the illumination light and thereby improve accuracy of the inspection.

Further, the inspection apparatus 1 uses a TDI sensor as the second detector 33. Therefore, it is possible to operate the second detector 33 at the same operating speed as that of the first detector 23. In this way, it is possible, for image data of an object to be inspected that is acquired at a high speed of several tens of kHz or higher, to correct a brightness distribution of illumination light L11 in real time. Therefore, it is possible to accurately correct images of the object to be inspected in real time.

If the second detector 33 is formed as a two-dimensional sensor, a one-frame rate of the two-dimensional sensor cannot be increased to 10 kHz. Therefore, when the brightness distribution rapidly changes, the two-dimensional sensor cannot follow (i.e., keep track of) the changes. In contrast to this, when the second detector 33 is constructed by using a TDI sensor as in the case of this embodiment, the second detector 33 can follow changes in the brightness distribution because the TDI sensor can be operated at a high speed of several tens of kHz or higher.

Further, in order to monitor the brightness distribution of the light source, part of the illumination light L11 is taken out and the remaining part of the illumination light L11 is used for the inspection of the object to be inspected. Therefore, it is possible to synchronize the acquisition of image data of the brightness distribution by the second detector 33 with the acquisition of image data of the object to be inspected by the first detector 23. Further, in a cross-sectional area of a cross section of the illumination light L11 perpendicular to the optical axis 15 thereof at a place where the cut mirror 31 is disposed, a cross-sectional area of the taken-out part of the illumination light L11 is made smaller than that of the remaining part of the illumination light L11. Therefore, it is possible to minimize the influence on the illumination light L11 used for the inspection of the object to be inspected and thereby accurately inspect the object to be inspected.

Second Embodiment

Next, a second embodiment is explained. In an inspection apparatus 2 according to this embodiment, a magnification of image data of a brightness distribution acquired by the monitoring unit 30 is made lower than a magnification of image data of an object to be inspected acquired by the detection optical system 20. A configuration of the inspection apparatus 2 according to the second embodiment is similar to that of the first embodiment and hence the explanation thereof is omitted. Accordingly, an operation performed by the inspection apparatus 2 is explained hereinafter. Similarly to the inspection apparatus 1 according to the first embodiment, an object to be inspected is illuminated by using critical illumination in a step S11 in FIG. 3. Next, as shown in a step S12 in FIG. 3, power variations are acquired from a brightness integrated value.

Each of FIGS. 8A, 9A, 10A and 11A shows an example of image data of a brightness distribution on the object to be inspected acquired by the first detector 23 in the inspection apparatus 2 according to the second embodiment. Further, each of FIGS. 8B, 9B, 10B and 11B shows an example of image data of a brightness distribution of the illumination light L11 acquired by the second detector 33 in the inspection apparatus 2 according to the second embodiment.

FIGS. 8A and 8B, FIGS. 9A and 9B, FIGS. 10A and 10B, and FIGS. 11A and 11B show images of brightness distributions at detection times T0 (t=0), T1 (t=Δt), T2 (t=2Δt), and T3 (t=3Δt), respectively.

Figure 8B:
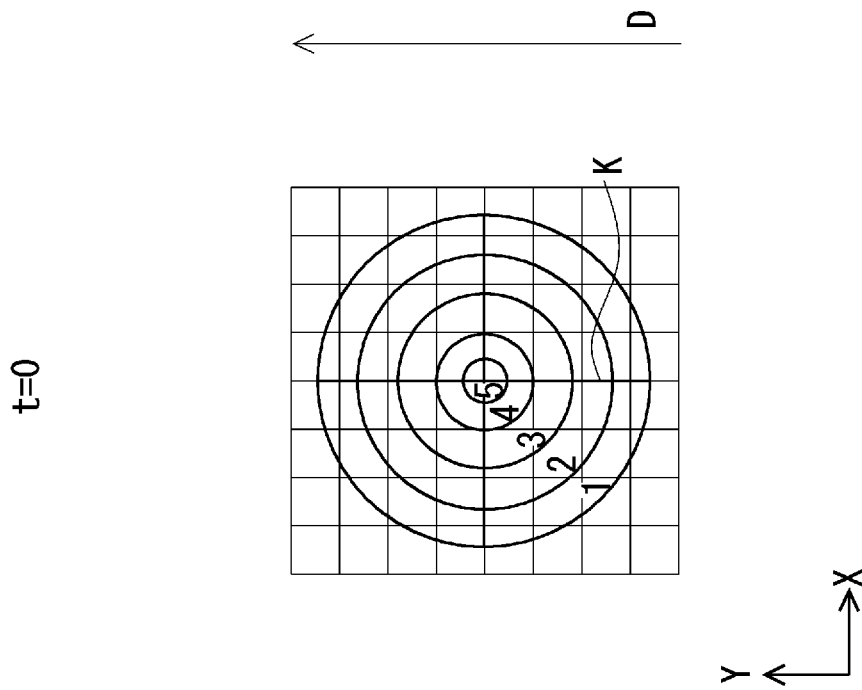
FIG. 8B is a diagram showing an example of image data of a brightness distribution of illumination light acquired by a second detector in the inspection apparatus according to the second embodiment.
Figure 8A:
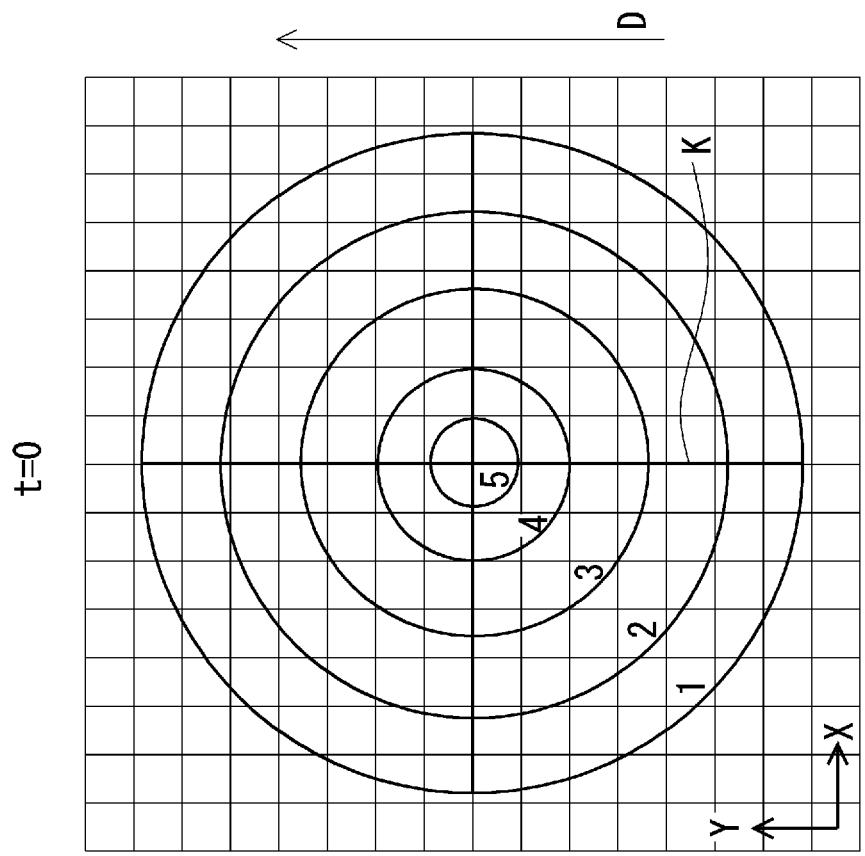
FIG. 8A is a diagram showing an example of image data of a brightness distribution on an object to be inspected acquired by a first detector in an inspection apparatus according to a second embodiment.

A magnification of image data of a brightness distribution of illumination light L11 shown in FIG. 8B is smaller than a magnification of image data of a brightness distribution on an object to be inspected shown in FIG. 8A. Therefore, a speed at which the second detector 33 performs scanning in the direction D (i.e., a line rate) is made lower than a line rate at which the first detector 23 performs scanning in the direction D according to the magnification. For example, assume that the magnification of the first detector 23 is 100 times and its line rate is 200 kHz. Then, when the magnification of the second detector 33 is 10 times, its line rate is set to 20 kHz. Further, the number of pixels is reduced in inverse proportion to the magnification ratio. For example, in the case where the pixel layout of the detector 23 is 1,000×1,000, when the magnification ratio is 10, the pixel layout of the detector 33 should be 100×100. In this way, it is possible to synchronize the acquisition of image data of the brightness distribution by the second detector 33 with the acquisition of image data of the object to be inspected by the first detector 23.

Further, the magnification of image data acquired by the second detector 33 is smaller than that of image data acquired by the first detector 23. Therefore, even when an amount of light is reduced, it is possible to secure a sufficient amount of light to acquire image data. That is, in a cross-sectional area of a cross section of the illumination light L11 perpendicular to the optical axis 15 thereof at a place where the cut mirror 31 is disposed, even when a cross-sectional area of the part of the illumination light taken out by the cut mirror 31 is made smaller than that of the remaining part of the illumination light L11, it is possible to secure an amount of light by which image data of the brightness distribution can be obtained. Therefore, it is possible to accurately correct the brightness distribution.

As shown in FIGS. 8A and 8B, at the detection time T0 (t=0), the image data of the brightness distribution on the object to be inspected is, for example, a concentric-circle image in which the closer the place is to the center the stronger its intensity becomes. As shown in FIG. 8B, the processing unit 40 calculates an integrated value P2 (t=0) of the brightness of the illumination light L11 based on one frame of image data of the brightness distribution acquired by the second detector 33. For example, the processing unit 40 calculates the integrated value P2 (t=0) by integrating brightness of one frame detected by the second detector 33 in a period in which the time t is expressed as "$-\Delta t_{exposure} \leq t \leq 0$", where $\Delta t_{exposure}$ is an integration time. Similarly to the first embodiment, the integrated value P2 (t=0) is expressed by the above-shown Expression (1).

Similarly to the first embodiment, the integrated value P2 (t=ti) at the detection time Ti (t=ti) is expressed by the above-shown Expression (2).

Variations in the integrated value P2 (ti) indicates power variations of the illumination light L11. In this way, the processing section 40 acquires the power variations of the illumination light L11. The acquired image data is output to the processing unit 40.

Next, as shown in a step S13 in FIG. 3, image data of the object to be inspected and image data of a brightness distribution of the illumination light L11 are acquired.

Figure 9B:
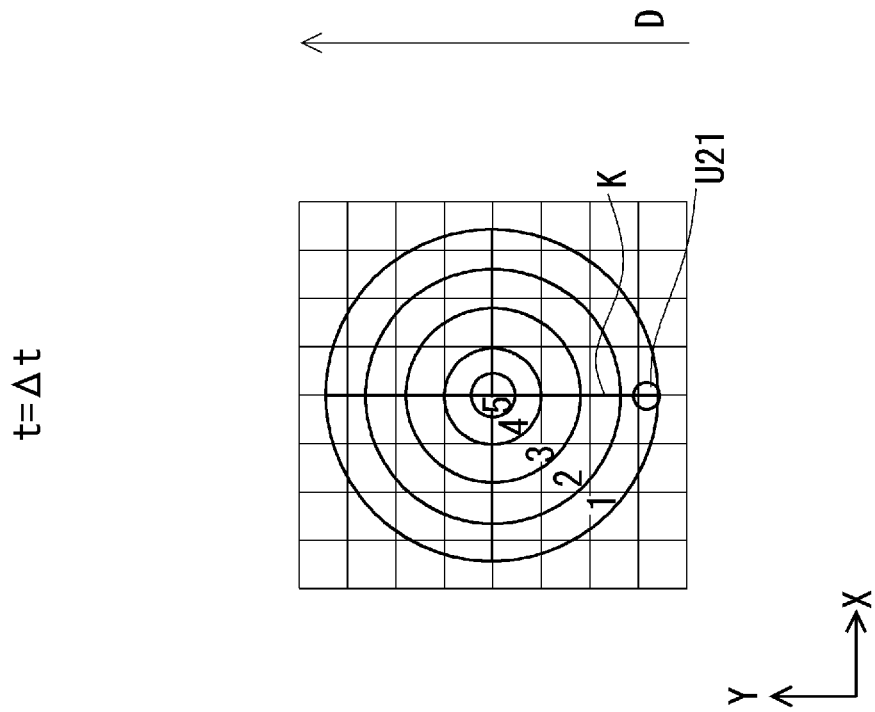
FIG. 9B is a diagram showing an example of image data of a brightness distribution of illumination light acquired by the second detector in the inspection apparatus according to the second embodiment.
Figure 9A:
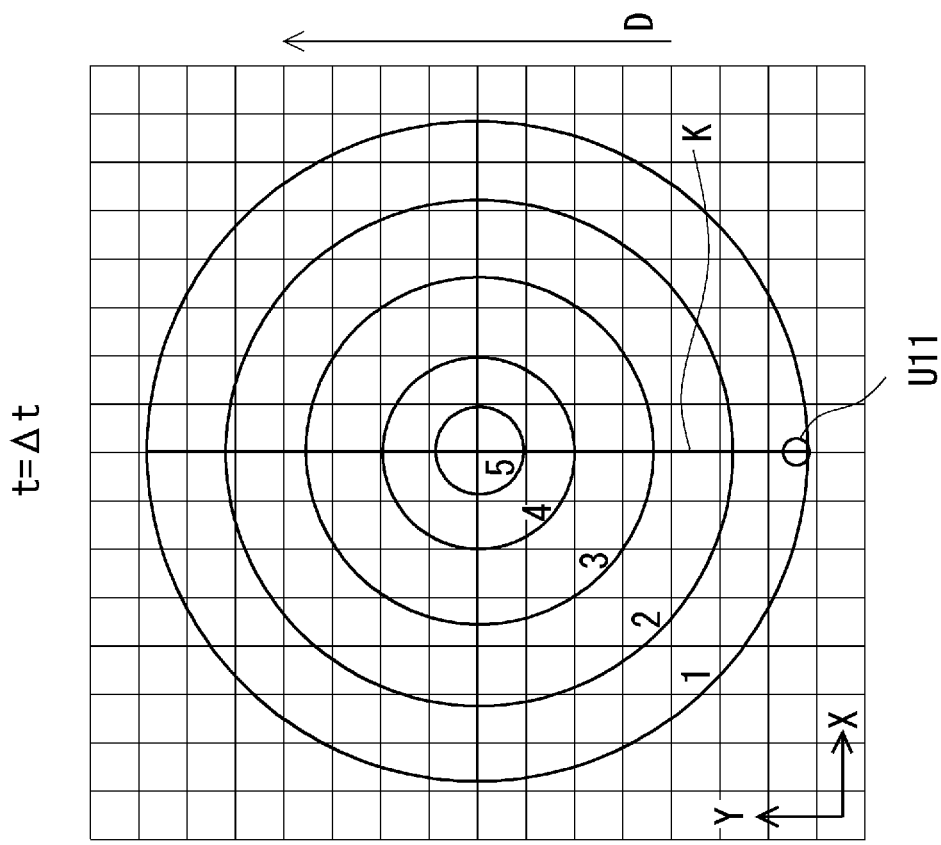
FIG. 9A is a diagram showing an example of image data of a brightness distribution on an object to be inspected acquired by the first detector in the inspection apparatus according to the second embodiment.

As shown in FIGS. 9A and 9B, at the detection time T1 (t=Δt), the brightness distribution of the illumination light L11 is, for example, a concentric-circle distribution as in the case of the distribution at the detection time T0. Each of detection positions U11 and U21 of the first and second detectors 23 and 33, respectively, is a predetermined position on the negative side in the Y-axis direction on a straight line K that extends in the Y-axis direction and passes through the center of concentric circles. The brightness values of both of the detection positions U11 and U21 are 1.

Figure 10B:
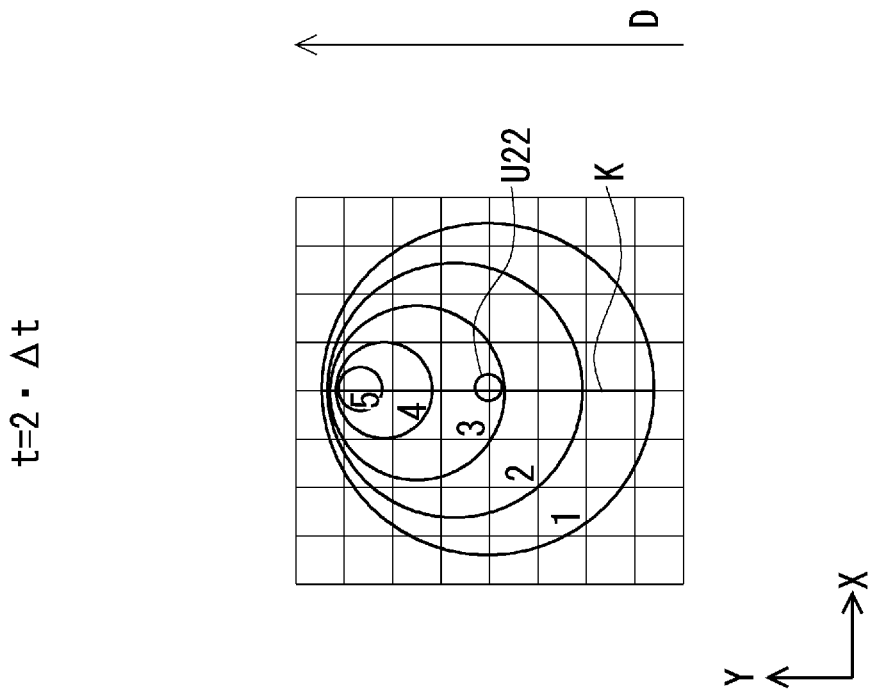
FIG. 10B is a diagram showing an example of image data of a brightness distribution of illumination light acquired by the second detector in the inspection apparatus according to the second embodiment.
Figure 10A:
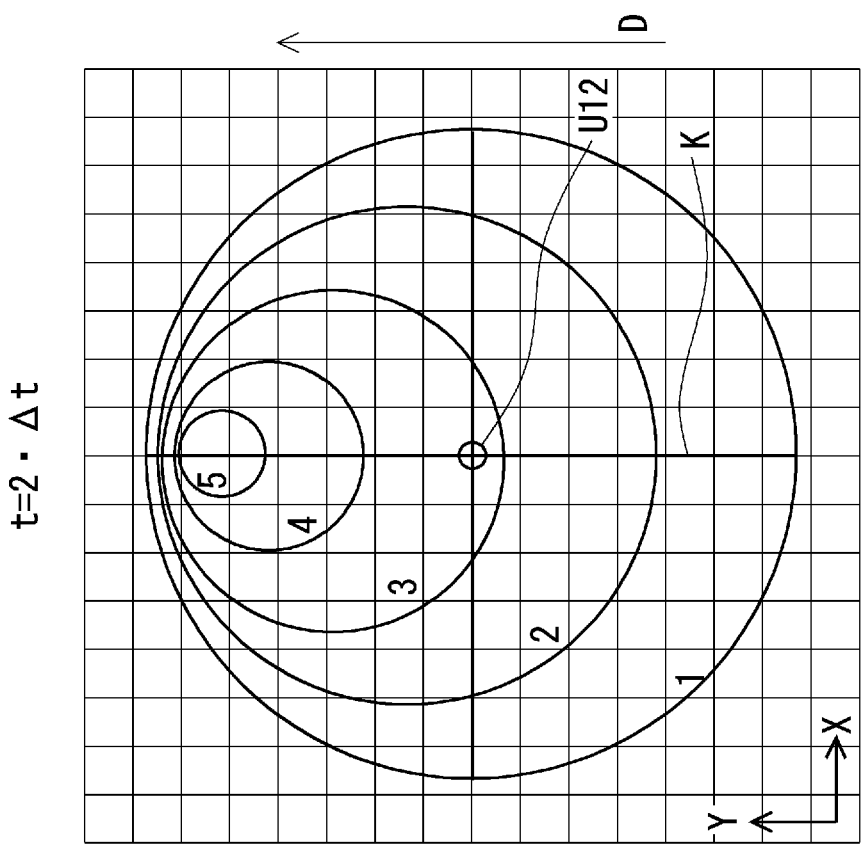
FIG. 10A is a diagram showing an example of image data of a brightness distribution on an object to be inspected acquired by the first detector in the inspection apparatus according to a second embodiment.

As shown in FIGS. 10A and 10B, at the detection time T2 (t=2·Δt), the brightness distribution of the illumination light L11 is, for example, a distribution whose center is deviated to the positive side in the Y-axis direction. Detection positions U12 and U22 of the first and second detectors 23 and 33, respectively, have been moved to the vicinity of the center of the straight line K. The brightness values of both of the detection positions U12 and U22 are 3.

Figure 11B:
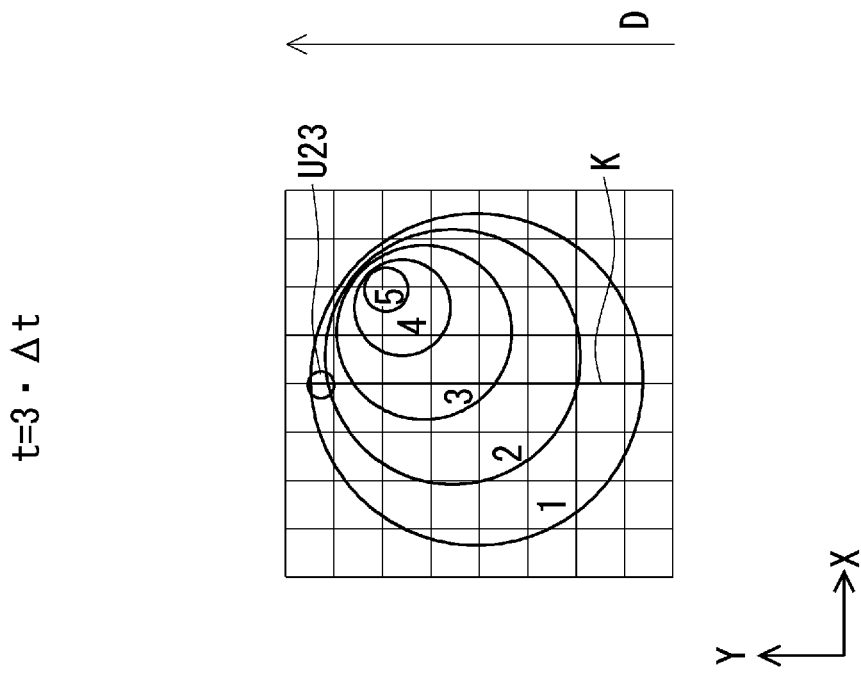
FIG. 11B is a diagram showing an example of image data of a brightness distribution of illumination light acquired by the second detector in the inspection apparatus according to the second embodiment.
Figure 11A:
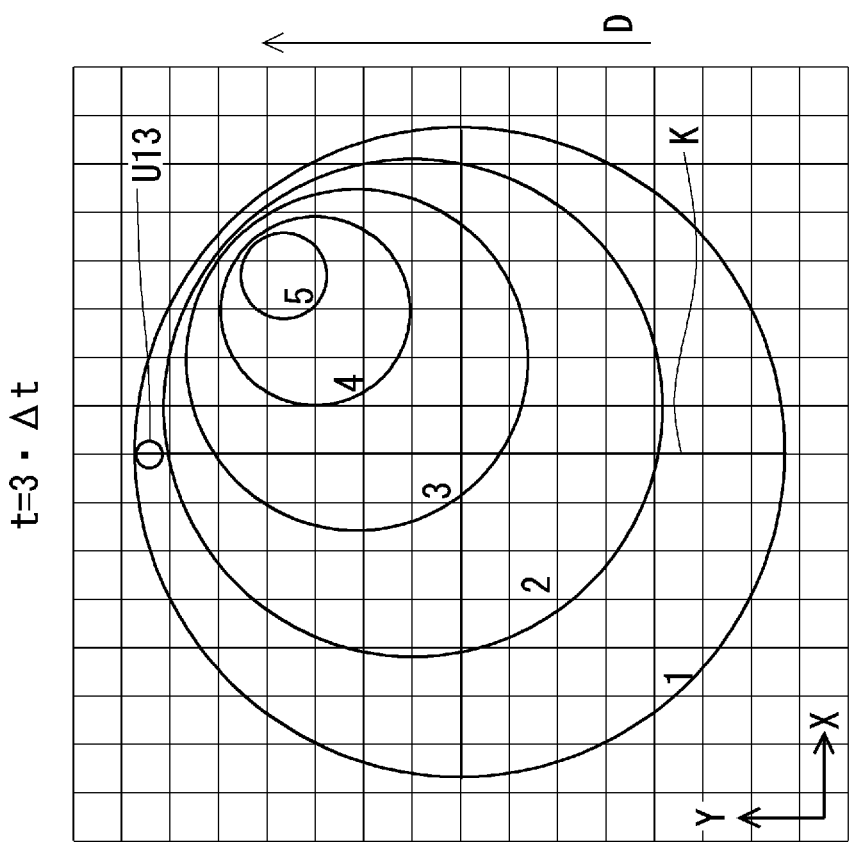
FIG. 11A is a diagram showing an example of image data of a brightness distribution on an object to be inspected acquired by the first detector in the inspection apparatus according to the second embodiment.

As shown in FIGS. 11A and 11B, at the detection time T3 (t=3·Δt), the brightness distribution of the illumination light L11 is, for example, a distribution whose center is deviated to the positive side in the X-axis direction and the positive side in the Y-axis direction. Detection positions U13 and U23 of the first and second detectors 23 and 33, respectively, have been moved in the Y-axis positive direction on the straight line K. The brightness values of both of the detection positions U13 and U23 are 1.

The number of image pickup elements included in the first detector 23 is, for example, equal to the number of image pickup elements included in the second detector 33. However, in the second embodiment, the number of pixels constituting image data acquired by the first detector 23 is larger than the number of pixels constituting image data acquired by the second detector 33. Therefore, data is interpolated between each pixel of the image data acquired by the second detector 33.

Figure 12:
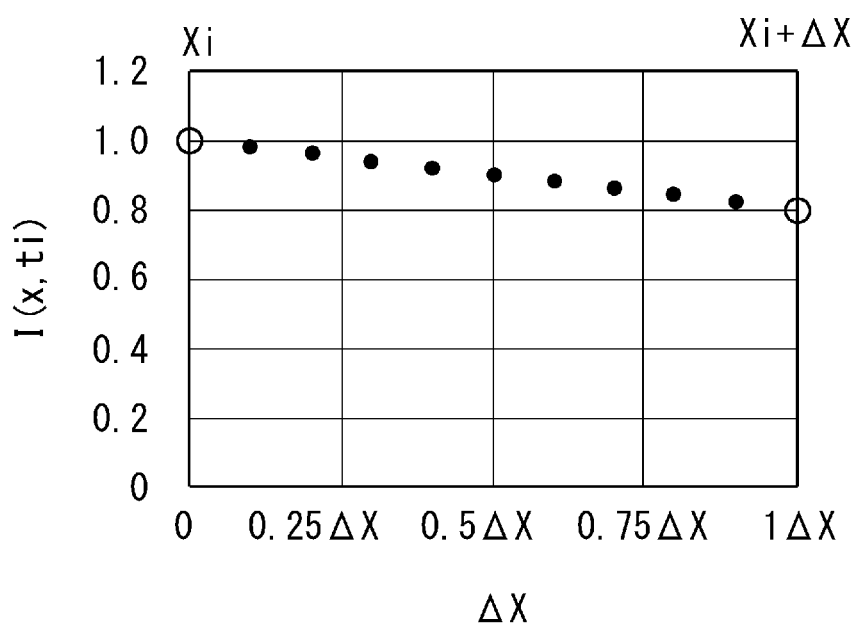
FIG. 12 is a graph showing an example of interpolation between pixels of image data acquired by the second detector in the inspection apparatus according to the second embodiment, in which a horizontal axis indicates positions between pixels and a vertical axis indicates brightness.

FIG. 12 is a graph showing an example of interpolation between pixels of image data acquired by the second detector 33 in the inspection apparatus 2 according to the second embodiment, in which a horizontal axis indicates positions between pixels and a vertical axis indicates brightness.

Note that the interpolating process between pixels is performed in a vertical direction (an X-axis direction), i.e., a direction perpendicular to the scanning direction, and a horizontal direction (a Y-axis direction), i.e., a direction parallel to the scanning direction. However, in the following explanation, only the interpolation in the X-axis direction is explained. Note that the interpolating process in the Y-axis direction is performed in a similar manner.

As shown in FIG. 12, a distance between pixels in image data acquired by the second detector 33 (i.e., a size of one pixel) is represented by "$\Delta X$". A method in which a pixel is interpolated between a pixel having brightness $I2(Xi, ti)$ at a position xi output at given time ti detected by the second detector 33 and a pixel having brightness $I2(Xi+\Delta X, ti)$ at a position $Xi+\Delta X$ while taking account of weighting that is determined according to a distance is shown below. For example, assume that brightness at a position $Xi+0.3\Delta X$ is expressed by the below-shown Expression (4).

$$I2(Xi+0.3\Delta X,ti)=I2(Xi,ti)\cdot(\Delta X-0.3\Delta X)/\Delta X+I2(Xi+\Delta X,ti)\cdot 0.3\Delta X/\Delta X \quad (4)$$

When the brightness 12 at time ti satisfies the below-shown Expressions (5) and (6), it also satisfies the below-shown Expression (7).

$$I2(Xi,ti)=1 \quad (5)$$

$$I2(Xi+\Delta X,ti)=0.8 \quad (6)$$

$$I2(Xi+0.3\Delta X,ti)=0.94 \quad (7)$$

In this way, as shown in FIG. 12, when the processing unit 40 corrects image data of an object to be inspected, it can interpolate data between a pixel at a position Xi and a pixel at a position $Xi+\Delta X$ included in image data of a brightness distribution. In this way, it is possible to conform a resolution of image data of the brightness distribution to that of image data of the object to be inspected. Note that the interpolation of data may be performed simultaneously with the correction based on the power variations and the brightness distribution, or may be performed during the synthesis of two-dimensional image data.

Next, as shown in a step S14 in FIG. 3, the image data of the object to be inspected is corrected based on the power variations and the brightness distribution of the illumination light L11. Specifically, the processing unit 40 performs a shading correction in which the power variations and the brightness distribution of the illumination light L11 are taken into account for each pixel of image data of the object to be inspected at each detection time acquired by the first detector 23.

In the shading correction, firstly, the brightness $I1(xi, ti)$ of each pixel of the image data acquired by the first detector 23 is corrected using the below-shown Expression (8).

$$I1'(xi,ti)=I1(xi,ti)\cdot\{P2(0)/P2(ti)\}\cdot\{I2ave(ti)/I2(xi,ti)\} \quad (8)$$

In the above-shown expression, $I1'(xi, ti)$ indicates corrected brightness in the image data acquired by the first detector 23. $I1(xi, ti)$ indicates brightness of a pixel at a position xi output at time ti. $I2ave(t)$ indicates an average value of the brightness distribution at time ti acquired by the second detector 33. $I2(xi, ti)$ indicates brightness of a pixel at a position xi output at time ti in the image data acquired by the second detector 33. Note that the position xi includes a position at which data is interpolated between a position Xi and a position $Xi+\Delta X$.

As described above, one-dimensional image data of the object to be inspected is corrected based on the power variations and the brightness distribution of the illumination light L11. When there are a plurality of frames, image data of the object to be inspected is corrected for every frame based on the power variations and the brightness distribution of the illumination light L11. Because of the fact that the inspection apparatus 2 according to this embodiment corrects image data of an object to be inspected as described above, the inspection apparatus 2 can be considered to be equipped with a correction apparatus.

Next, as shown in a step S15 in FIG. 3, the object to be inspected is inspected based on the corrected image data of the object to be inspected. Specifically, two-dimensional image data of the object to be inspected is acquired by detecting reflected light L12, i.e., the illumination light L11 that has been reflected on the EUV mask 50, i.e., the object to be inspected. The two-dimensional image data is data that is obtained by correcting one-dimensional image data acquired by the first detector 23 based on a brightness distribution and power variations acquired by the second detector 33 and arranging (or lining up) the corrected one-dimensional image data in the scanning direction. The two-dimensional image data contains information on a defect on the object to be inspected and the like. For example, a defect or the like is detected as an image in a bright-field observation. In this way, it is possible to inspect the object to be inspected.

Next, advantageous effects of this embodiment are explained.

The magnification of image data acquired by the monitoring unit 30 is made lower than that of image data acquired by the detection optical system 20. In this way, it is possible to increase an amount of light that is used for the detection by the second detector 33 and thereby accurately correct the brightness distribution of the illumination light L11.

Further, data is interpolated between each pixel included in image data of the brightness distribution. In this way, it is possible to conform a resolution of image data of the brightness distribution to that of image data of the object to be inspected and thereby accurately correct the brightness distribution of the light source. Other advantageous effects are similar to those in the first embodiment.

Modified Example 1

Figure 13:
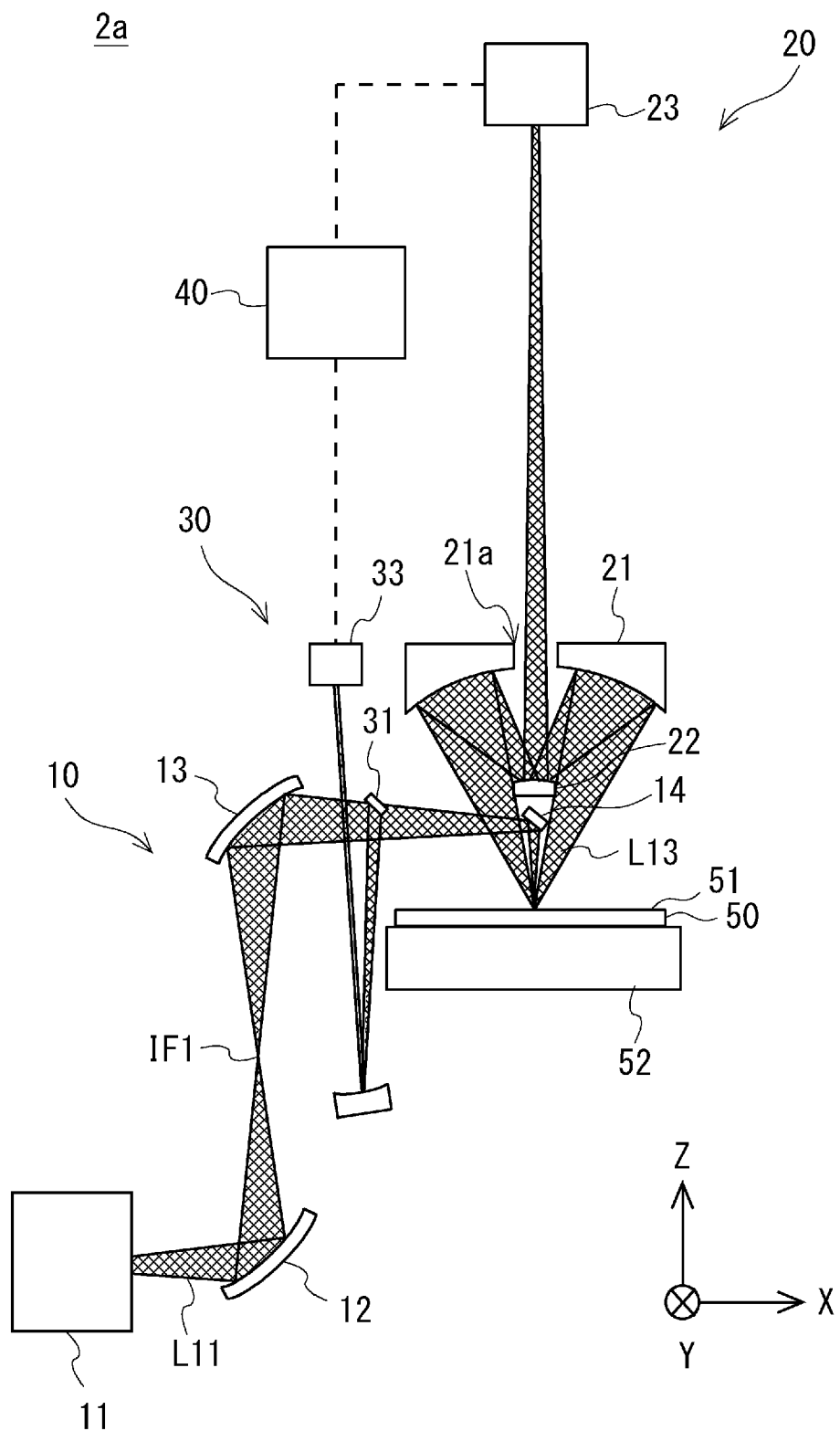
FIG. 13 is a configuration diagram showing an example of an inspection apparatus according to a modified example 1 of the second embodiment.

Next, modified examples 1 to 3 are explained. The modified examples 1 to 3 are examples in which the detection optical system 20 is modified. The modified examples 1 to 3 are explained as modified examples of the second embodiment. However, they can be regarded as modified examples of the first embodiment in which the magnifications of the first and second detectors 23 and 33 are roughly equal to each other. FIG. 13 is a configuration diagram showing an example of an inspection apparatus according to a modified example 1 of the second embodiment. As shown in FIG. 13, compared to the inspection apparatus 2 according to the second embodiment, the incident angle of the illumination light L11 is changed in the inspection apparatus 2a according to the modified example 1. That is, the dropping mirror 14 makes the illumination light L11 incident on the EUV mask 50 in the vertical direction. Specular reflection light of the illumination light L11 reflected on the EUV mask 50 is not detected by the first detector 23.

However, when there is a defect or the like on the EUV mask 50, part of the illumination light L11 is scattered by the defect or the like and becomes scattered light L13. The scattered light L13 from the EUV mask 50 is incident on the holed concave mirror 21 and is detected by the first detector 23. That is, when there is no defect, a dark image is obtained. Therefore, the above-described method is called a dark-field observation. As described above, in the modified example 1, scattered light L13 from an object to be inspected illuminated by illumination light L11 is concentrated. Then, image data of the object to be inspected is acquired by detecting the concentrated scattered light L13 by the first detector 23. By the above-described configuration, it is possible to inspect a defect or the like present in the object to be inspected. The rest of the configuration and other advantageous effects are similar to those in the first and second embodiments.

Modified Example 2

Figure 14:
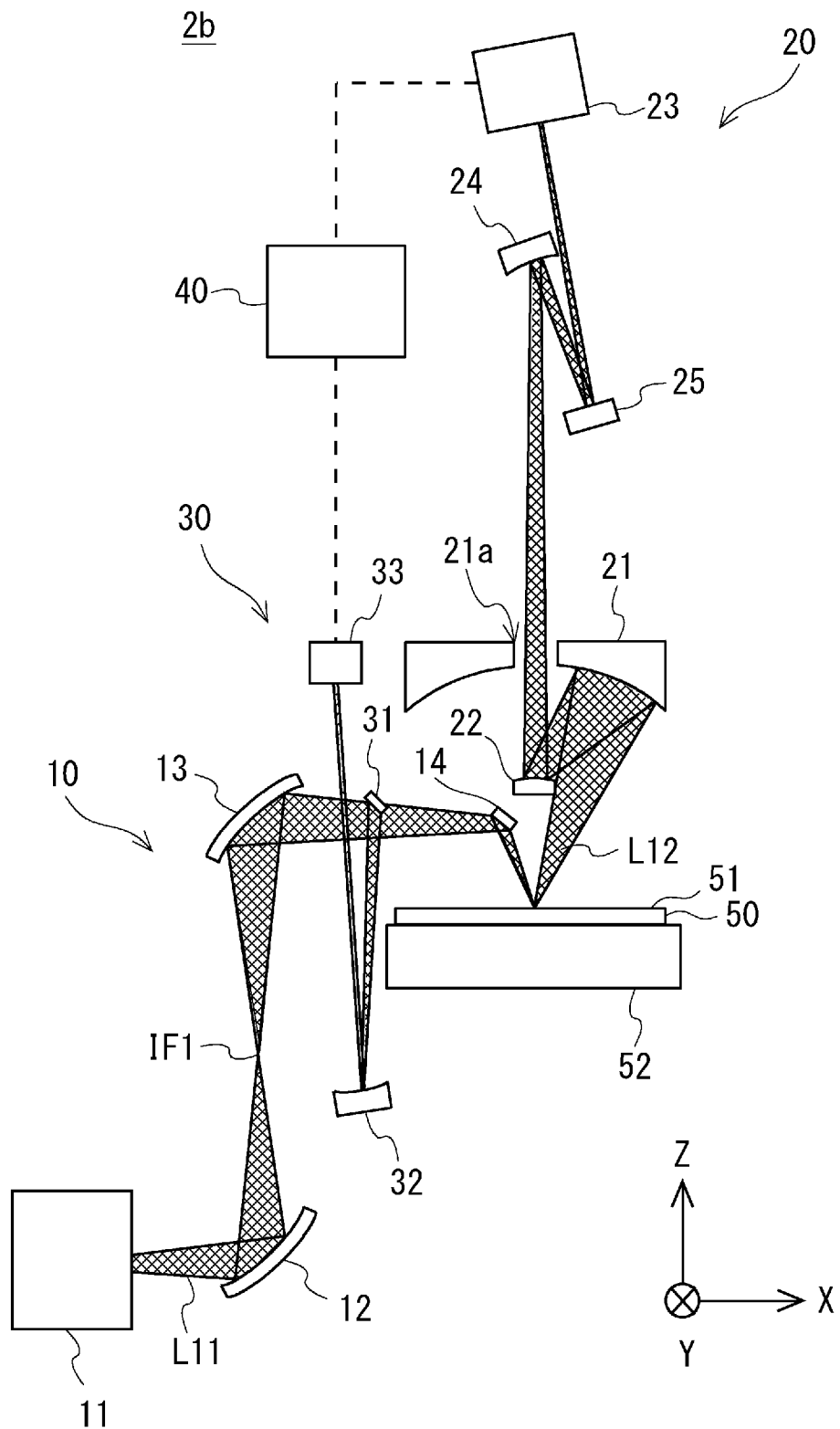
FIG. 14 is a configuration diagram showing an example of an inspection apparatus according to a modified example 2 of the second embodiment.

Next, a modified example 2 of the second embodiment is explained. FIG. 14 is a configuration diagram showing an example of an inspection apparatus according to the modified example 2 of the second embodiment. As shown in FIG. 14, compared to the inspection apparatus 2 according to the second embodiment, the inspection apparatus 2b according to the modified example 2 includes a concave mirror 24 and a plane mirror 25. In this way, it is possible to increase the magnification of the inspection apparatus 2b to several times to several tens of times higher than the magnification of the inspection apparatus 2. Therefore, it is possible to accurately inspect (i.e., determine) a shape of a defect or the like. A position of a defect present on an object to be inspected may be first located by the inspection apparatus 2 according to the second embodiment or the inspection apparatus 2a according to the modified example 1 and then a shape of the located defect may be inspected (i.e., determined) by the inspection apparatus 2b according to the modified example 2. Therefore, it is possible to reduce the time required for the inspection and accurately inspect an object to be inspected. The rest of the configuration and other advantageous effects are similar to those in the first and second embodiments.

Modified Example 3

Figure 15:
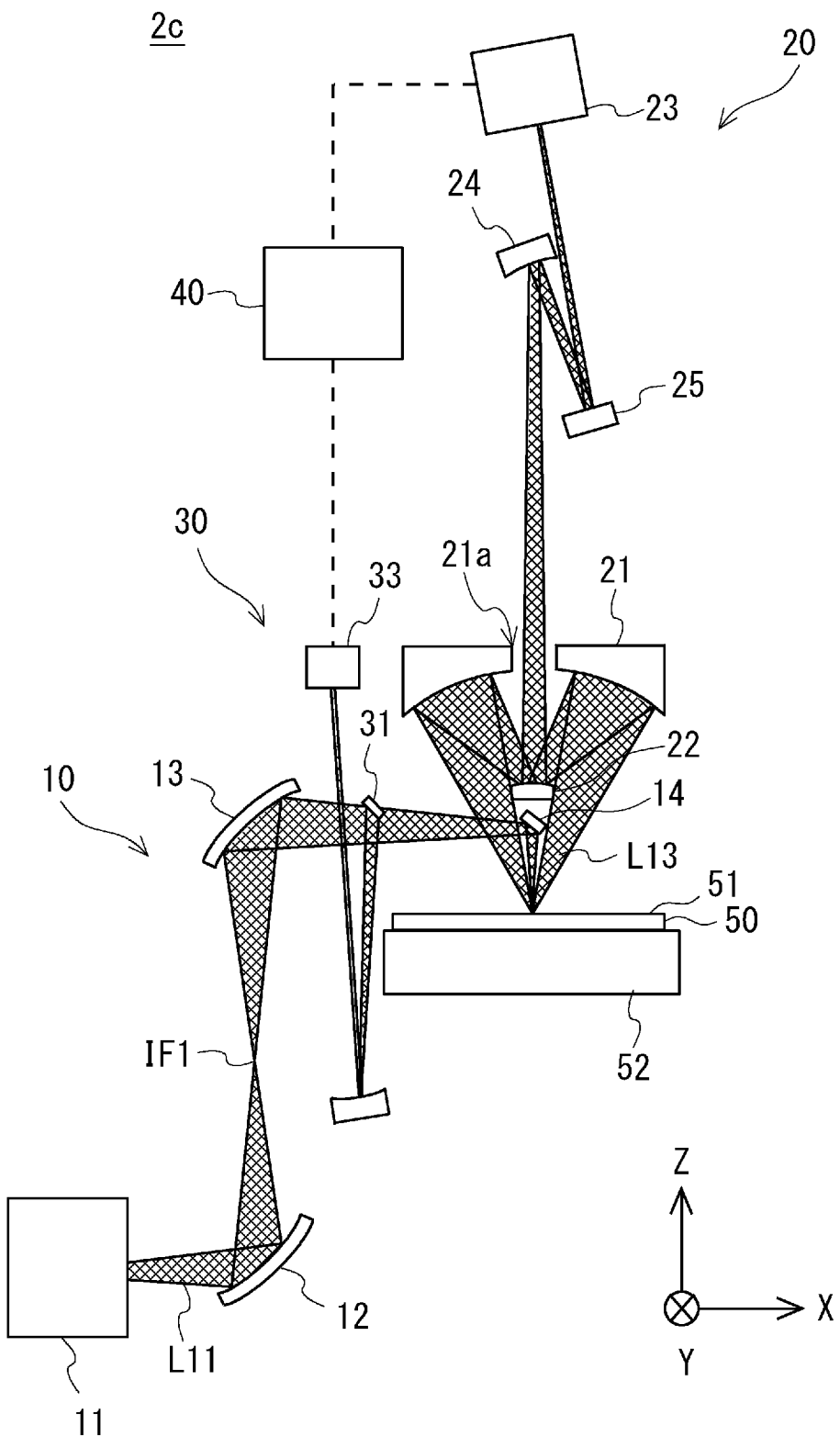
FIG. 15 is a configuration diagram showing an example of an inspection apparatus according to a modified example 3 of the second embodiment.

Next, a modified example 3 of the embodiment is explained. FIG. 15 is a configuration diagram showing an example of an inspection apparatus according to a modified example 3 of the embodiment. As shown in FIG. 15, the inspection apparatus 2c according to the modified example 3 has a configuration that is obtained by adding a concave mirror 24 and a plane mirror 25 in the inspection apparatus 2a according to the modified example 1. In this way, it is possible to increase the magnification of the inspection apparatus 2c to several times to several tens of times higher than the magnification of the inspection apparatus 2a and accurately inspect (i.e., determine) a shape of a defect or the like. Therefore, it is possible to reduce the time required for the inspection and accurately inspect an object to be inspected. The rest of the configuration and other advantageous effects are similar to those in the previously-described embodiments.

Embodiments of the present disclosure have been explained above. However, the present disclosure is not limited to the above-described configurations, and they can be modified without departing from the technical idea of the present disclosure.

From the present disclosure thus described, it will be obvious that the embodiments of the present disclosure may be varied in many ways. Such variations are not to be regarded as a departure from the spirit and scope of the present disclosure, and all such modified examples as would be obvious to one skilled in the art are intended for inclusion within the scope of the following claims.

What is claimed is:

1. A correction method comprising:
    illuminating an object to be inspected by using critical illumination by illumination light generated by a light source;
    concentrating light from the object to be inspected illuminated by the illumination light and acquiring image data of the object to be inspected by detecting the concentrated light by a first detector;
    acquiring image data of a brightness distribution of the illumination light detected by irradiating a second detector with critical illumination by using part of the illumination light; and
    correcting the image data of the object to be inspected based on the image data of the brightness distribution;
    wherein a magnification of the image data of the brightness distribution is made lower than a magnification of the image data of the object to be inspected;
    wherein when the image data of the object to be inspected is corrected, data is interpolated between each pixel included in the image data of the brightness distribution and a resolution of the image data of the brightness distribution is conformed to a resolution of the image data of the object to be inspected.

2. The correction method according to claim 1, wherein a detector comprising a TDI sensor is used for the first and second detectors.

3. A correction apparatus comprising:
    an illumination optical system configured to illuminate an object to be inspected by using critical illumination by illumination light generated by a light source;
    a detection optical system configured to concentrate light from the object to be inspected illuminated by the illumination light and acquire image data of the object to be inspected by detecting the concentrated light by a first detector;
    a monitor unit configured to acquire image data of a brightness distribution of the illumination light detected by irradiating a second detector with critical illumination by using part of the illumination light; and
    a processing unit configured to correct the image data of the object to be inspected based on the image data of the brightness distribution;
    wherein a magnification of the image data of the brightness distribution acquired by the monitor unit is lower than a magnification of the image data of the object to be inspected acquired by the detection optical system;
    wherein the processing unit interpolates data between each pixel included in the image data of the brightness distribution and thereby conforms a resolution of the image data of the brightness distribution to a resolution of the image data of the object to be inspected.

4. The correction apparatus according to claim 3, wherein each of the first and second detectors is a detector comprising a TDI sensor.

5. An inspection apparatus comprising a correction apparatus according to claim 3, wherein the processing unit inspects the object to be inspected based on the corrected image data of the object to be inspected.

* * * * *